(12) United States Patent
Crozier et al.

(10) Patent No.: US 7,375,528 B2
(45) Date of Patent: May 20, 2008

(54) SHIELDED, ASYMMETRIC MAGNETS FOR USE IN MAGNETIC RESONANCE IMAGING

(75) Inventors: Stuart Crozier, Brisbane (AU); Feng Liu, Forest Lake (AU)

(73) Assignee: Magnetica Limited, Brisbane, Queensland (AU)

( * ) Notice: Subject to any disclaimer, the term of this patent is extended or adjusted under 35 U.S.C. 154(b) by 97 days.

(21) Appl. No.: 11/390,913

(22) Filed: Mar. 28, 2006

(65) Prior Publication Data
US 2006/0255805 A1 Nov. 16, 2006

Related U.S. Application Data

(60) Provisional application No. 60/666,137, filed on Mar. 29, 2005.

(51) Int. Cl.
*G01V 3/00* (2006.01)
(52) U.S. Cl. .................. 324/319; 324/320; 335/299
(58) Field of Classification Search ............... 324/319, 324/320, 318, 322; 335/299, 216, 301
See application file for complete search history.

(56) References Cited

U.S. PATENT DOCUMENTS

| | | | |
|---|---|---|---|
| 5,396,207 A | 3/1995 | Dorri et al. | |
| 5,416,415 A | 5/1995 | Dorri et al. | |
| 5,517,169 A | 5/1996 | Laskaris et al. | |
| 5,646,532 A | 7/1997 | Knuttel et al. | |
| 5,801,609 A | 9/1998 | Laskaris et al. | |
| 5,818,319 A | 10/1998 | Crozier et al. | |
| 6,064,290 A * | 5/2000 | Xu et al. | 335/296 |
| 6,140,900 A | 10/2000 | Crozier et al. | |
| 6,218,923 B1 | 4/2001 | Laskaris et al. | |
| 6,570,475 B1 | 5/2003 | Lvovsky et al. | |
| 6,700,468 B2 * | 3/2004 | Crozier et al. | 335/299 |
| 7,109,708 B2 * | 9/2006 | Havens | 324/307 |
| 7,212,004 B2 * | 5/2007 | Doddrell et al. | 324/319 |
| 2003/0155998 A1 | 8/2003 | Takeshima et al. | |

OTHER PUBLICATIONS

Caldwell, J., "The stress in the windings of a coil carrying an electric current," J. Phys, D: Appl. Phys., 13(1980) 1379-82.
Chan et al., Solving quadratically constrained least squares using block box unconstrained solvers. BIT 32: 481-495, (1992).

(Continued)

Primary Examiner—Louis M. Arana
(74) Attorney, Agent, or Firm—Maurice M. Klee

(57) ABSTRACT

Magnetic resonance systems are provided which employ a shielded, asymmetric magnet to produce an offset dsv. The magnets include at least a first coil $C_1$, which carries current in a first direction, and two coils $C_2$ and $C_3$, which are located at least in part within the internal envelope $E_{C1}$ defined by the first coil and which carry current in an opposite direction to the first coil. The magnets are shielded by a shielding coil $C_4$, which carries current in a direction opposite to that of the first coil, and/or a ferromagnetic structure (FS). The magnets can include additional coils, such as a fifth coil $C_5$ at the magnet's distal end. The magnets can be used in, for example, orthopedic imaging.

21 Claims, 24 Drawing Sheets

OTHER PUBLICATIONS

Crozier et al. (S. Crozier, H. Zhao and D.M. Doddrell, Current Density Mapping Approach for Design of Clinical Magnetic Resonance Imaging Magnets, Concepts in Magnetic Resonance (Magnetic Resonance Engineering), vol. 15(3) 208-215 (2002).

Lawrence C.T., and Tits A.L., A Computationally Efficient Feasible Sequential Quadratic Programming Algorithm, STAM Journal on Optimization, 11(4):1092-1118, 2001.

Zhao et al., "Asymmetric MRI Magnet Design Using a Hybrid Numerical Method," Journal of Magnetic Resonance, 141:340-346, 1999.

Zhao, H. and Crozier, S., "Rapid field calculations for the effect of ferromagnetic material in MRI magnet design," Meas. Sci. Technol., 13:198 205, 2002.

Zhao, H. and Crozier, S., "A design method for superconducting MRI magnets with ferromagnetic material," Meas. Sci. Technol., 13:2047-2052, 2002.

* cited by examiner

SHIELDED, ASYMMETRIC MAGNETS FOR USE IN MAGNETIC RESONANCE IMAGING

CROSS REFERENCE TO RELATED APPLICATION

This application claims the benefit under 35 USC §119(e) of U.S. Provisional Application No. 60/666,137 filed Mar. 29, 2005, the contents of which in its entirety is hereby incorporated by reference.

I. FIELD OF THE INVENTION

The present invention relates to shielded, asymmetric superconducting and non-superconducting magnets for producing substantially homogeneous magnetic fields ($B_0$ fields) for use in magnetic resonance imaging (MR imaging). The shielding can be active, passive, or a combination thereof. The magnets are particularly well-suited for use in producing images of an extremity of a subject, e.g., a subject's limb or head.

II. DEFINITIONS

As used herein, the following terms and phrases shall have the following meanings:
(1) "Proximal" and "distal" refer to the orientation of the magnet relative to the subject during imaging.
(2) The phrase "ends of the magnet" means the farthest outward axial locations of the coils making up the magnet. The "proximal end of the magnet" is the end closest to the subject during imaging, and the "distal end of the magnet" is the end farthest from the subject during imaging.
(3) A "turn distribution function" for a magnet is the number of turns of wire used in the magnet as a function of distance along the magnet's longitudinal axis from the magnet's proximal end to its distal end. The turn distribution function uses the actual turn count, irrespective of differences in the wire cross section of different coils which may be used in certain embodiments of the invention to achieve different current density values for a constant transport current.
(4) The phrase "calculated hoop stress within a current carrying coil" is the stress value calculated using the equation:

$$\sigma_\theta = \frac{J}{6r\ln(r_2/r_1)}[B_1(r_2^2 + r_1 r_2 - 2r_1^2) + B_2(2r_2^2 - r_1 r_2 - r_1^2)] \quad \text{Eq. (1)}$$

where $r_1$ and $r_2$ are the coil's inner and outer radii, respectively, and $B_1$ and $B_2$ are the axial magnetic flux densities at $r_1$ and $r_2$, respectively. See Equation (1) of "The stress in the windings of a coil carrying an electric current," *J Phys, D: Appl. Phys.*, 13 (1980) 1379-82, the contents of which are incorporated herein by reference in their entirety.

III. BACKGROUND OF THE INVENTION

The field of clinical magnetic resonance imaging (MRI) depends for its success on the generation of strong and pure magnetic fields. A major specification of the static field in MRI is that it has to be substantially homogeneous over a predetermined region, known in the art as the "diameter spherical imaging volume" or "dsv." Errors less than 20 parts per million peak-to-peak (or 10 parts per million rms) are typically required for the dsv. The uniformity of the field in the dsv is often analyzed by a spherical harmonic expansion.

The basic components of a typical magnetic resonance system for producing diagnostic images for human studies include a main magnet (i.e., a superconducting or non-superconducting magnet which produces the substantially homogeneous magnetic field (the $B_0$ field) in the dsv), one or more shim magnets, a set of gradient coils, and one or more RF coils. Discussions of MRI, including magnet systems for use in conducting MRI studies, can be found in, for example, Mansfield et al., *NMR in Imaging and Biomedicine*, Academic Press, Orlando, Fla., 1982, and Haacke et al., *Magnetic Resonance Imaging: Physical Principles and Sequence Design*, John Wiley & Sons, Inc., New York, 1999. See also Crozier et al., U.S. Pat. No. 5,818,319, Crozier et al., U.S. Pat. No. 6,140,900, Crozier et al., U.S. Pat. No. 6,700,468, Dorri et al., U.S. Pat. No. 5,396,207, Dorri et al., U.S. Pat. No. 5,416,415, Knuttel et al., U.S. Pat. No. 5,646,532, and Laskaris et al., U.S. Pat. No. 5,801,609, the contents of which are incorporated herein by reference in their entireties.

In modern medical imaging, there is a distinct and long-felt need for smaller magnetic resonance systems. The typical aperture of a conventional MRI machine is a cylindrical space having a diameter of about 0.6-0.8 meters, i.e., just large enough to accept the subject's shoulders, and a length of about 2.0 meters or more. The dsv for such systems is located near the center of the aperture, which means that it is typically about a meter from the end of the aperture.

Not surprisingly, many people suffer from claustrophobia when placed in such a space. Also, the one-meter distance between the portion of the subject's body which is being imaged and the end of the magnet system means that physicians cannot easily assist or personally monitor a subject during an MRI procedure.

In addition to its effects on the subject, the size of the magnet is a primary factor in determining the cost of an MRI machine, as well as the costs involved in the siting of such a machine. In order to be safely used, MRI machines often need to be shielded so that the magnetic fields surrounding the machine at the location of the operator are below FDA-specified exposure levels. By means of shielding, the operator can be safely sited much closer to the magnet than in an unshielded system. Larger magnets require more shielding and larger shielded rooms for such safe usage, thus leading to higher costs.

Extremity MRI (also known as orthopedic MRI) is one of the growth areas of the MRI industry, with 20% of all MRI procedures in the United States in 2002 being performed on upper (e.g., arms, wrists, and elbows) and lower (e.g., legs, ankles, and knees) extremities. Extremity MRI systems are much smaller than whole-body or conventional MRI systems and are much easier to site, due both to their reduced size and reduced stray fields. They are therefore a low cost solution to the imaging of extremities.

While extremity MRI systems have a number of advantages to the subject and the operator, they represent a challenge in terms of the space available for the various coils making up the magnet and in terms of cooling those coils, whether they be superconducting or resistive coils. The close spacing between coils can also lead to high peak fields in some circumstances, as well as to substantial inter-coil and intra-coil stresses.

The present invention is directed to providing magnets which address these and other challenges of extremity MRI systems.

IV. SUMMARY OF THE INVENTION

The present invention provides a magnetic resonance system for producing MR images comprising a magnet which has a longitudinal axis (13) and produces a longitudinal magnetic field over a predetermined region (the "dsv"), said magnet comprising a plurality of current-carrying coils (e.g., a total of six coils) which surround the axis, are distributed along the axis, and define a turn distribution function T(z) for the magnet which varies with distance z along the axis and is equal to the sum of the number of turns in all coils at longitudinal position z, wherein:

(A) the longitudinal extent of the plurality of coils defines first (proximal) and second (distal) ends for the magnet;

(B) the dsv defines a midpoint M which is closer to the first end than to the second end;

(C) the turn distribution function T(z) is asymmetric with respect to distance z along the longitudinal axis, with more than 50 percent of the turns being located closer to the first end than to the second end;

(D) the plurality of current-carrying coils comprises:
  (i) a first coil ($C_1$) which has an inner radius $R_{in}$, an outer radius $R_{out}$, and which:
    (a) provides a contribution to the magnetic field at the center of the dsv that is larger in magnitude than the magnitude of the contribution of any other of the plurality of current-carrying coils,
    (b) is located closer to the first end than to the second end, and
    (c) defines an internal envelope ($E_{C1}$); and
  (ii) second ($C_2$) and third ($C_3$) coils each of which:
    (a) has an outer radius which is less than $R_{in}$;
    (b) lies at least in part within the internal envelope ($E_{C1}$) of the first coil; and
    (c) carries current in a direction opposite to the direction of current in the first coil ($C_1$); and (E) to reduce stray magnetic fields external to the magnet:
  (i) the plurality of coils comprises a fourth coil ($C_4$) which:
    (a) has an inner radius which is greater than $R_{in}$; and
    (b) carries current in a direction opposite to the direction of current in the first coil ($C_1$); and/or
  (ii) the magnet comprises a ferromagnetic structure (FS) which is rotationally-symmetric about the longitudinal axis and whose minimum inner radius is greater than $R_{in}$.

In certain embodiments, the fourth coil ($C_4$), when used: (a) has an inner radius which is greater than or equal to $R_{out}$, and/or (b) defines an internal envelope ($E_{C4}$) and at least a portion of the first coil ($C_1$) lies within said internal envelope.

In other embodiments, the ferromagnetic structure (FS), when used has a minimum inner radius that is greater than or equal to $R_{out}$.

In further embodiments, all coils which lie either entirely or partially within the internal envelope of the first coil ($E_{C1}$) carry current in a direction opposite to the direction of current in the first coil ($C_1$).

Preferably, the plurality of coils comprises a fifth coil ($C_5$) which can define the second (distal) end of the magnet and which:

(a) has an outer radius which is less than $R_{in}$;
(b) lies outside of the internal envelope ($E_{C1}$) of the first coil ($C_1$); and
(c) carries current in the same direction as the current in the first coil ($C_1$).

The plurality of coils can also comprise:
(i) a coil ($C_{A1}$) which:
  (a) has an outer radius which is less than $R_{in}$;
  (b) lies at least in part within the internal envelope ($E_{C1}$) of the first coil ($C_1$); and
  (c) carries current in a direction opposite to the direction of current in the first coil ($C_1$); and/or
(ii) a coil ($C_{A2}$) which:
  (a) has an outer radius which is less than or equal to $R_{in}$;
  (b) lies outside of the internal envelope ($E_{C1}$) of the first coil ($C_1$); and
  (c) carries current in the same direction as the current in the first coil ($C_1$).

The shielded, asymmetric magnets of the invention have the advantage of allowing the part of the body to be imaged to be located very close to the end of the magnet during scanning. This means that the subject can be more comfortable during the procedure and that a greater range of imaging applications are possible. The magnets are particularly advantageous in imaging of a subject's extremities since for these applications, they can have small dimensions which make them relatively inexpensive to manufacture and easy to site in a health care facility.

The reference symbols used in the above summary of the invention are only for the convenience of the reader and are not intended to and should not be interpreted as limiting the scope of the invention. More generally, it is to be understood that both the foregoing general description and the following detailed description are merely exemplary of the invention, and are intended to provide an overview or framework for understanding the nature and character of the invention as it is claimed.

Additional features and advantages of the invention are set forth in the detailed description which follows, and in part will be readily apparent to those skilled in the art from that description or recognized by practicing the invention as described herein. Both these additional aspects of the invention and those discussed above can be used separately or in any and all combinations.

The accompanying drawings are included to provide a further understanding of the invention, and are incorporated in and constitute a part of this specification. The drawings illustrate various embodiments of the invention, and together with the description serve to explain the principles and operation of the invention. The drawings are drawn to scale and are intended to indicate the relative proportions of the elements shown therein. In the drawings and the specification, like parts in related figures are identified by like reference symbols.

V. BRIEF DESCRIPTION OF THE DRAWINGS

FIGS. 1A, 2A, 3A, and 4A show the coil configurations of Examples 1, 2, 3, and 4, respectively.

FIGS. 1B, 2B, 3B, and 4B are plots showing dsv sizes and locations, as well as calculated axial magnetic field strengths for the magnets of Examples 1, 2, 3, and 4, respectively. The field strengths are shown by the gray scales set forth in the figures.

FIGS. 1C, 2C, 3C, and 4C are plots showing calculated magnitudes of the total magnetic field within the coils of Examples 1, 2, 3, and 4, respectively. The strengths of the fields are shown by the gray scales set forth in the figures.

FIGS. 1D, 2D, 3D, and 4D are plots showing calculated hoop stresses within the coils of Examples 1, 2, 3, and 4, respectively. The stresses were calculated using the formula set forth above for $\sigma_\theta$.

FIGS. 1E, 2E, 3E, and 4E are plots showing calculated external stray field counters for the magnets of Examples 1, 2, 3, and 4, respectively. The plots include the location of the 5 Gauss (0.0005 Tesla) line for each magnet.

Figure 1A:
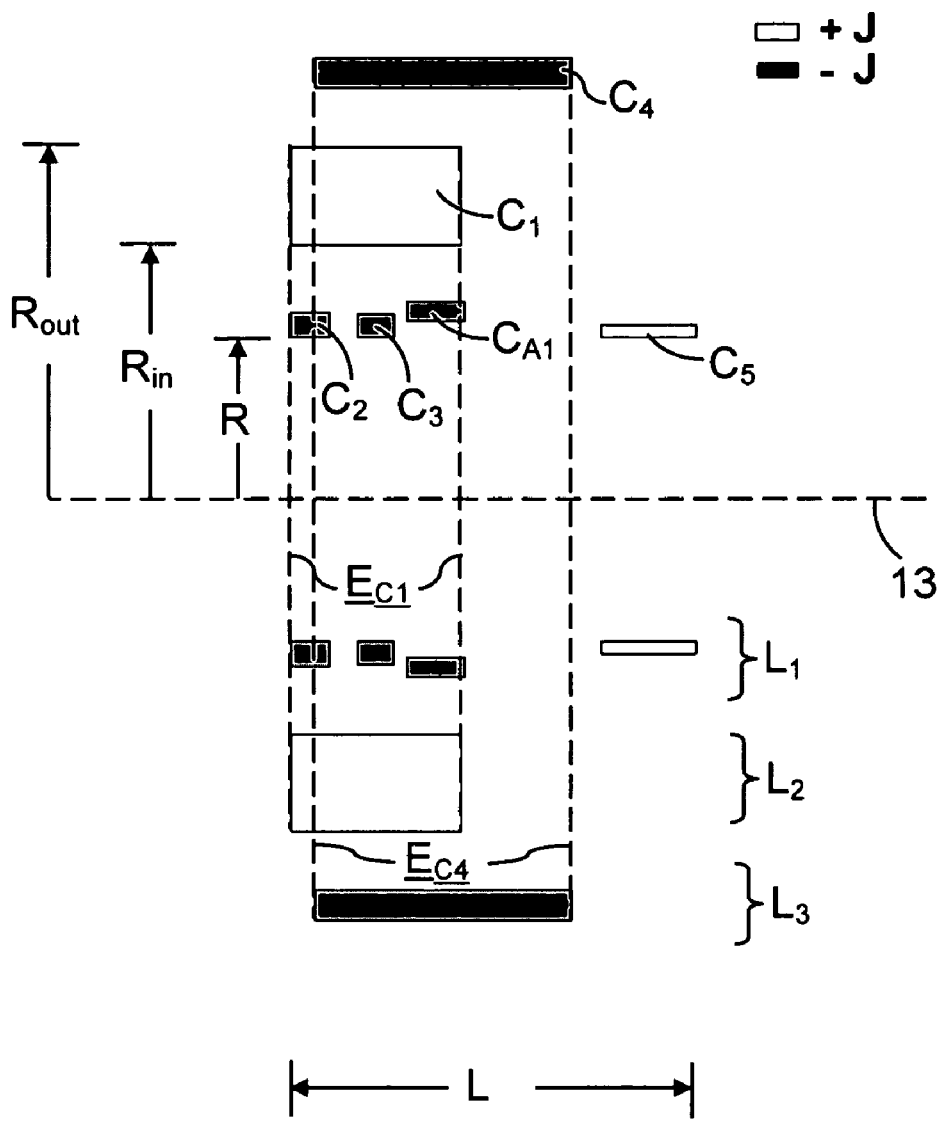
FIG. 1F is a perspective view of the magnet of Example 1.
FIG. 1G is a turn distribution function for the magnet of Example 1.

The reference symbols used in the figures correspond to the following:

$C_1$ first coil
$C_2$ second coil
$C_3$ third coil
$C_4$ fourth coil
$C_5$ fifth coil
$C_{A1}$ additional coil (current in opposite direction to first coil)
$C_{A2}$ additional coil (current in same direction as first coil)
FS ferromagnetic structure
$E_{C1}$ internal envelope of first coil
$E_{C4}$ internal envelope of fourth coil
$L_1$ first layer
$L_2$ second layer
$L_3$ third layer
13 longitudinal axis of magnet

VI. DETAILED DESCRIPTION OF THE INVENTION AND ITS PREFERRED EMBODIMENTS

As discussed above, the present invention relates to magnetic resonance systems which comprise superconducting or non-superconducting magnets having an asymmetric structure. As illustrated in FIGS. 1A, 2A, 3A, and 4A, the coils of the magnet are generally arranged in three layers, i.e., layers $L_1$, $L_2$, and $L_3$ in these figures. Such an arrangement is advantageous for purposes of constructing the magnet since a single former can be used for each layer. However, the invention is not limited to magnets which have a layered structure, but include any magnets which have the basic structure described above in the Summary of the Invention. For ease of discussion and without limitation, the following detailed description of the invention will use the $L_1$, $L_2$, and $L_3$ terminology.

The asymmetric magnets of the invention have a strongest coil (the $C_1$ coil) which is located near the proximal (first) end of the magnet. This coil can be the only coil of the $L_2$ layer, or that layer can include a second coil near to the distal end of the magnet, which carries current in the same direction as the $C_1$ coil. Additional coils can be used in the $L_2$ layer if desired. This layer can also include one or more ferromagnetic structures, e.g., one or more iron rings, which can improve the homogeneity in the dsv and/or reduce peak fields and/or hoop stresses.

In addition to the $C_1$ coil, the magnets of the invention have at least two coils ($C_2$ and $C_3$) which carry current in a direction opposite to the $C_1$ coil. These coils are located near the proximal (first) end of the magnet and at least in part are located within the internal envelope defined by the $C_1$ coil (i.e., the space marked $E_{C1}$ in the figures). The $C_2$ and $C_3$ coils form the proximal end of the $L_1$ layer. In addition to these coils, the $L_1$ layer typically includes a coil (the $C_5$ coil) which is located near the distal end of the $L_1$ layer and carries current in the same direction as the $C_1$ coil. The $C_5$ coil often forms the distal end of the magnet. Additional coils can be used in the $L_1$ layer, including coils which carry current in a direction opposite to the $C_1$ coil (see the $C_{A1}$ coils in the figures) and coils which carry current in the same direction as the $C_1$ coil (see the $C_{A2}$ coils in the figures). As with the $L_2$ layer, the $L_1$ layer can also include one or more ferromagnetic structures to improve the homogeneity in the dsv and/or to reduce peak fields and/or hoop stresses.

As shown in FIGS. 1A, 2A, 3A, and 4A, the $L_1$ layer has either two or three coils which are located within the internal envelope ($E_{C1}$) defined by the $C_1$ coil and carry current in a direction opposite to that of the $C_1$ coil. Although not wishing to be bound by any particular theory of operation, it is believed that this arrangement of coils allows the magnet to have an offset dsv and at the same time to have lower levels of calculated hoop stress in the coils making up the magnet compared to arrangements where one or more coils within the internal envelope carry current in the same direction as the $C_1$ coil.

To achieve an offset dsv requires the use of at least some coils carrying current in an opposite direction to that of the strongest coil in the magnet. Hoop stress, on the other hand, tends to be locally higher when the magnet includes two coils which carry current in opposite directions and are close to one another. Thus, to reduce hoop stress, the $L_1$ layer preferably has coils grouped together which carry current in the same direction. Accordingly, the coils of the $L_1$ layer that are located within the envelope of the strongest coil preferably all carry current in the same direction to reduce hoop stress, and that direction is opposite to that of the strongest coil to achieve an offset dsv.

This grouping of coils carrying current in the same direction, although seen to some extent in large magnets, tends to become even more important for small magnets, e.g., magnets used to image extremities, because all of the distances involved become smaller and the forces (stresses) between adjacent coils increase as the spacing between coils decreases. Thus, the grouping pattern is especially valuable when the distance between the edge of the dsv and the proximal end of the magnet is less than or equal to about 15 centimeters and the overall length (L) of the magnet is less than or equal to about 60 centimeters, the outermost diameter of the magnet is less than or equal to about 120 centimeters, and the cold bore diameter of the magnet is equal to or greater than about 30 centimeters, because such dimensions reduce the spacing available for separating the coils.

In addition to the $C_1$, $C_2$, and $C_3$ coils, the magnets of the invention also include a shielding coil (the $C_4$ coil) and/or a ferromagnetic structure (the FS structure). The shielding coil carries current in a direction opposite to the $C_1$ coil. The $C_4$ coil and/or the FS structure form the $L_3$ layer.

Instead of a single shielding coil, the $L_3$ layer can include a plurality of separate coils, e.g., two coils with one located at the distal end and another at the proximal end of the magnet. Similarly, the FS structure can be divided into two or more components if desired. Other variations include an FS structure with a shielding coil on either side or a shielding coil with an FS structure on either side. More complex patterns employing 4 or more coils/FS structures can be used if desired.

Various materials can be used for the coils and the FS structure(s) of the magnet. The coils can be made from various types of superconducting materials known in the art. Because the peak magnetic fields and stresses are controlled in the magnets of the invention, superconducting wires having reduced amounts of superconducting materials, e.g., niobium-titanium alloys, can be used. The FS structure(s) are made of high permeability materials, the most common and inexpensive of which is soft iron. The coils and FS structure(s) are constructed using standard techniques known in the art. In the case of non-superconducting magnets, the coils are composed of high conductivity metals, such as copper, and again, the FS structure(s) when used are composed of high permeability materials, such as soft iron.

As illustrated by the examples presented below, the magnets of the invention preferably have some and most preferably all of the following features and structural characteristics:

(1) three layers of coils, with preferably at least two of the layers having an asymmetric turn distribution function such that at least 50% of the turns in the layer are closer to the proximal end of the magnet than to the distal end;

(2) the three layers have a negative, positive, negative arrangement in terms of the orientation of the axial magnetic fields which they produce at the center of the dsv;

(3) the third layer serves primarily for shielding, the second layer is the primary source of the homogeneous field in the dsv, and the first layer primarily serves to correct inhomogeneities in the dsv field; and/or (4) at any axial location, there are no more than three radially stacked coils (this arrangement facilitates manufacture of the magnet).

In the preferred embodiments of the invention, the magnets achieve some and, most preferably, all of the following performance criteria:

(1) an overall diameter that is less than or equal to 120 centimeters, (2) an overall diameter that is less than or equal to 120 centimeters and a smallest internal coil radius which is greater than or equal to 15 centimeters, (3) an overall length that is less than or equal to 60 centimeters, (4) a dsv whose size and homogeneity are sufficient for effective MR imaging (preferably, at a homogeneity level of 20 parts per million peak-to-peak relative to the value of $B_0$ at the dsv's midpoint, the dsv has a volume ($V_{dsv}$) of at least 2,000 cm$^3$ for a magnet having a cold bore volume $V_{bore}$ which is less than or equal to 8,000 cm$^3$, e.g., the $V_{dsv}/V_{bore}$ ratio is preferably greater than or equal to 0.2), (5) a highly offset dsv (i.e., a dsv that is located closer to the proximal end of the magnet than the distal end, which facilitates extremity imaging, e.g., a dsv having an edge which is preferably 15 centimeters, more preferably, 10 centimeters, and most preferably, 5 centimeters from the proximal end of the magnet), (6) sufficient spacing between coils to allow effective cryogenic cooling, (7) low peak magnetic fields within the coils to allow for the use of less expensive superconducting wire (e.g., a calculated peak magnetic field within any of the plurality of current carrying coils whose magnitude is less than about 5 times the calculated axial magnetic field at the center of the dsv), (8) low stress levels which facilitate construction of the magnet and minimize the chances of prototype failure (e.g., a maximum calculated hoop stress within any of the plurality of current carrying coils that is less than or equal to 250 MPa), and/or (9) low stray fields (e.g., a calculated stray magnetic field external to the magnet that is less than or equal to $5 \times 10^{-4}$ Tesla at all locations greater than 2 meters from the midpoint of the dsv).

EXAMPLES

Without intending to limit it in any manner, the present invention will be more fully described by the following examples. The following procedures were used in determining the coil configurations and turn distribution functions of the examples.

Figure 5:
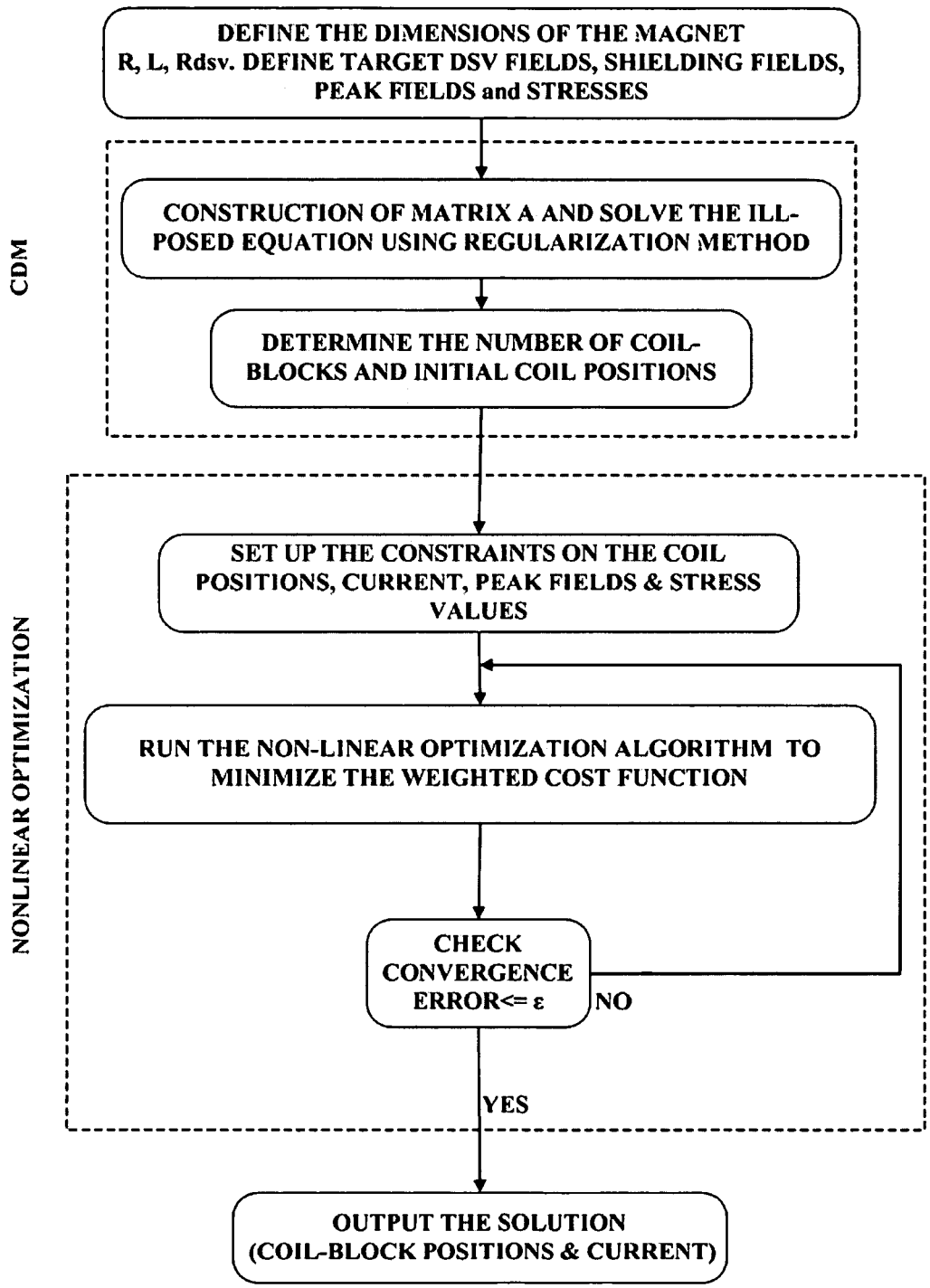
FIG. 5 is a flow chart illustrating the process used to design the magnets of Examples 1-4.

The coil positions and current densities were determined in a two step process (see FIG. 5). In the first step, a Current Density Map (CDM) was calculated throughout a designated allowed space for conductors, and initial coil positions were estimated from the CDM (see below). In the second step, the coil sizes and positions were refined to produce the final magnet solution.

The current density calculations were based on the method of Crozier et al. (S. Crozier, H. Zhao and D. M. Doddrell, Current Density Mapping Approach for Design of Clinical Magnetic Resonance Imaging Magnets, Concepts in Magnetic Resonance (Magnetic Resonance Engineering), Vol 15(3) 208-215 (2002)), with the exception that the optimization was performed using a least squares optimization minimization with a quadratic inequality constraint (see T. F. Chan, J. Olkin and D. W. Cooley, Solving quadratically constrained least squares using block box unconstrained solvers. BIT 32: 481-495, (1992)) utilizing Singular Value Decomposition. In this method, the CDM matrix defines a grid of the available space rather than a series of lines used to approximate the space as was used in the initial CDM method. The use of a grid facilitates initial block estimation and is therefore advantageous. For magnets which included ferromagnetic structures (e.g., Example 3 below), the method of Zhao, H. and Crozier, S., "Rapid field calculations for the effect of ferromagnetic material in MRI magnet design," Meas. Sci. Technol., 13:198-205, 2002 (Zhao et al. 2002a), was used. Another method for designing such magnets is disclosed in Zhao, H. and Crozier, S., "A design method for superconducting MRI magnets with ferromagnetic material," Meas. Sci. Technol., 13:2047-2052, 2002 (Zhao et al. 2002b).

Figure 6:
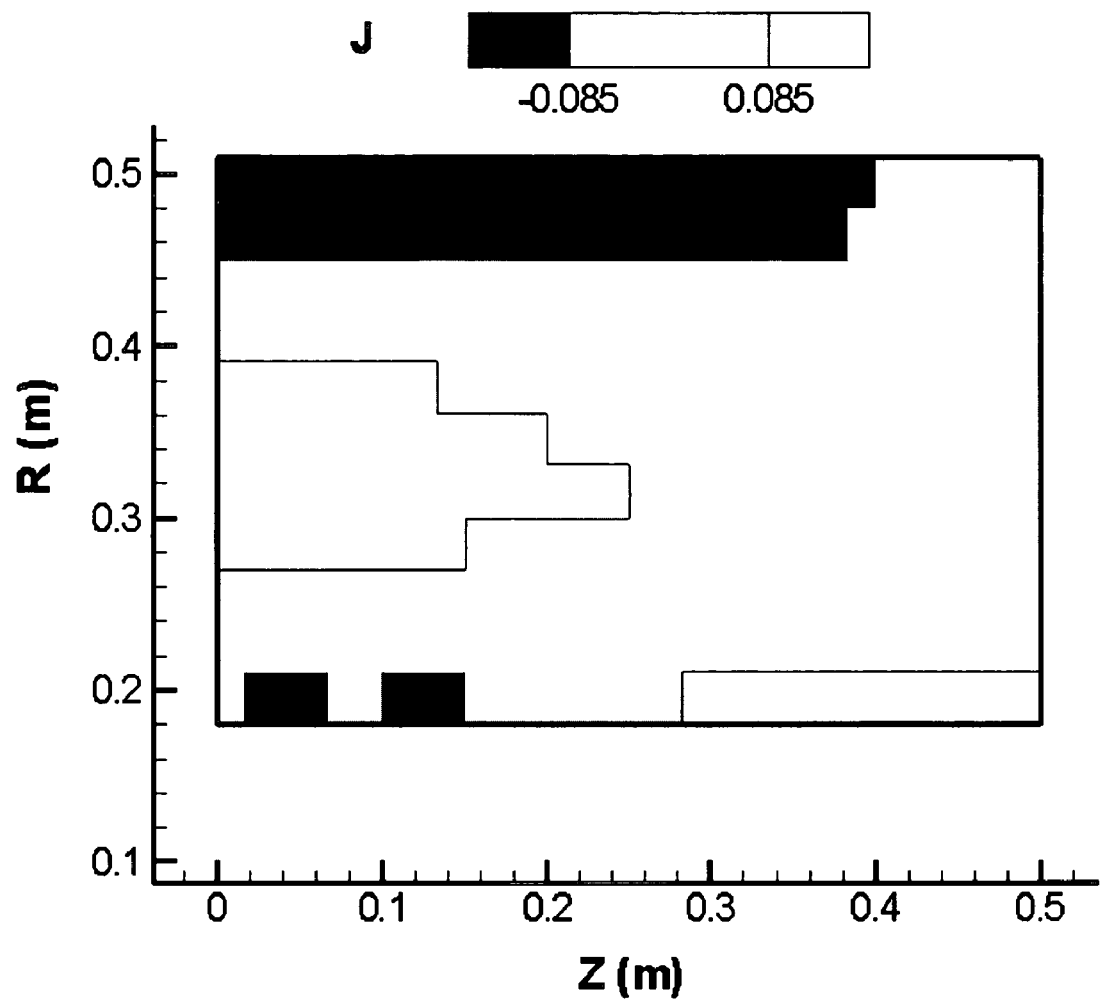
FIG. 6 is a plot showing a current density map (CDM) used in determining the initial coil locations and turn distribution function for the magnet of Example 2. Similar CDM plots were used in the other examples.

Peak fields within the coils, an estimate of unsupported, indicative, hoop stress (e.g., equation (1) above), shielding performance and DSV homogeneity were included in the error function which was minimized to produce the CDM. FIG. 6 shows a typical result for a CDM calculated using this method. This CDM is for Example 2 below.

Initial block positions were then estimated from the CDM. Specifically, to obtain initial coil shapes and positions, each elemental value of the CDM was treated as a pixel intensity of a two-dimensional, grey-scaled image, and was then converted to a binary image by thresholding. The output binary image had values of 0 (black) for all pixels in the pseudo image with an intensity value less than the threshold level and 1 (white) for all other pixels. Positive and negative current values were treated separately in this scheme. A labeling technique was used to connect components in the binary image, and each region was labeled with a different number. The maximal label number was the total number of coils. The labeling technique produced a best fit of the selected rectangular blocks to the CDM.

A further refinement of the coils' positions was performed using a constrained numerical optimization technique based on a Sequential Quadratic Programming (SQP) scheme (Lawrence C. T., and Tits A. L., A Computationally Efficient Feasible Sequential Quadratic Programming Algorithm, *SIAM Journal on Optimization*, 11(4):1092-1118, 2001). The routine used the geometry and positions of the field generating elements as parameters and the error terms mentioned above to calculate the final coil geometry for the magnet.

The contents of the above Crozier et al., Chan et al., Zhao et al. 2002a, Zhao et al. 2002b, and Lawrence et al. references are incorporated herein by reference in their entireties.

Example 1

This example illustrates an asymmetric, superconducting magnet of the present invention. In broad overview, the magnet employs six coils and has a cold bore length (L) and a cold bore inner radius (R) of approximately 0.5 and 0.18 meters, respectively. The magnet employs a positive coil ($C_5$) at the magnet's distal end, and three negative coils located near the magnet's proximal end, all of which are at least partially within the internal envelope ($E_{C_1}$) defined by the magnet's strongest coil (the $C_1$ coil). The magnet employs active shielding provided by coil $C_4$. Two of the magnet's coils ($C_1$ and $C_4$) have lower current densities than the remaining coils.

Figure 1B:
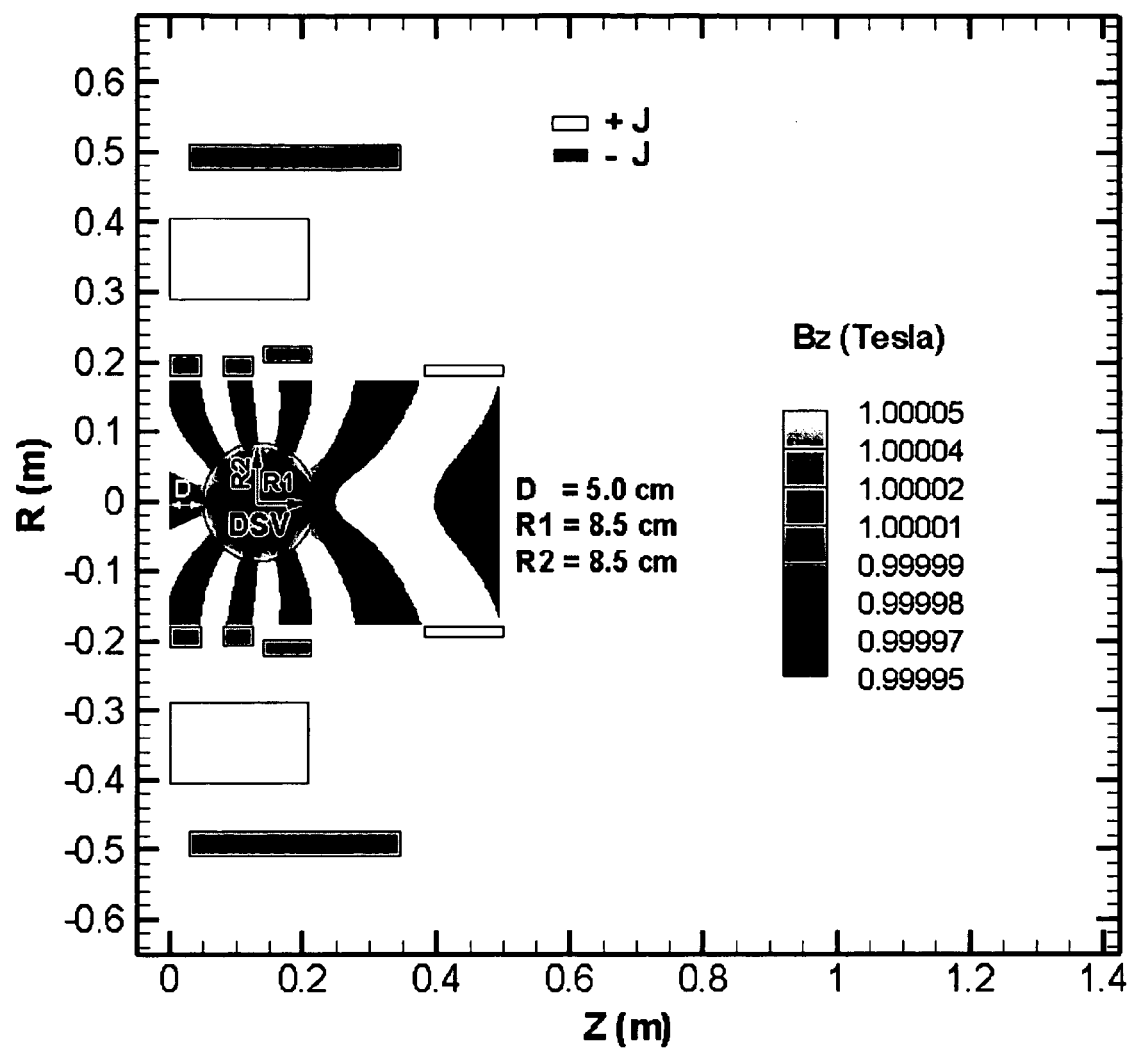
Figure 1C:
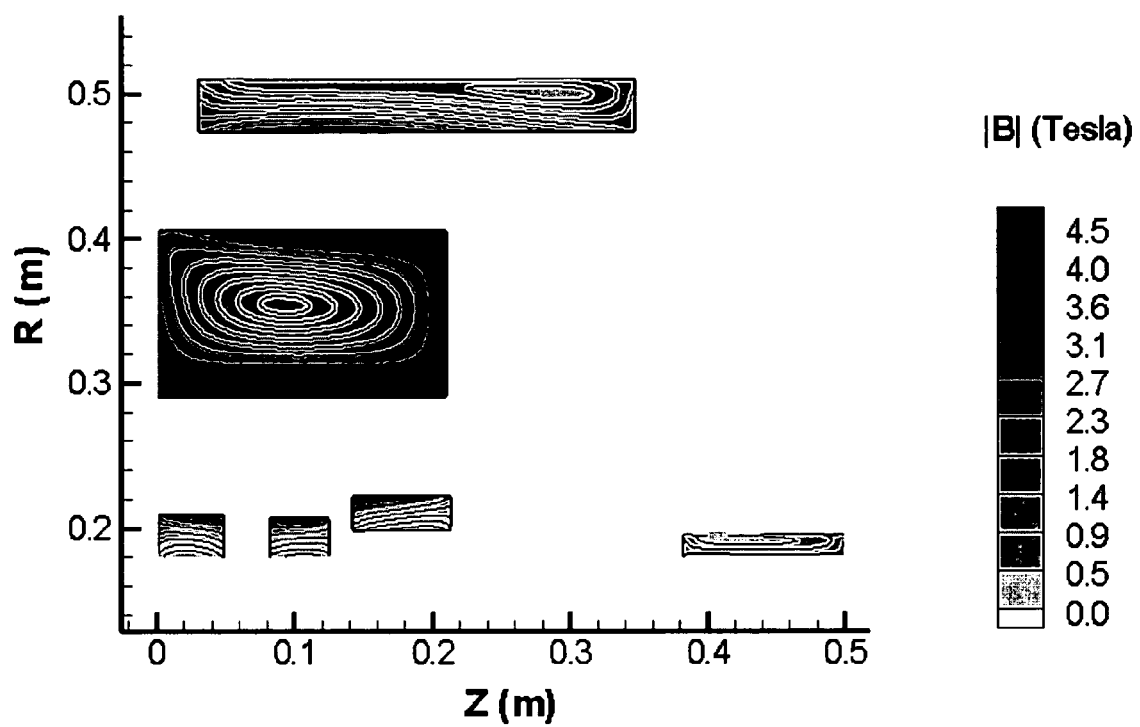
Figure 1D:
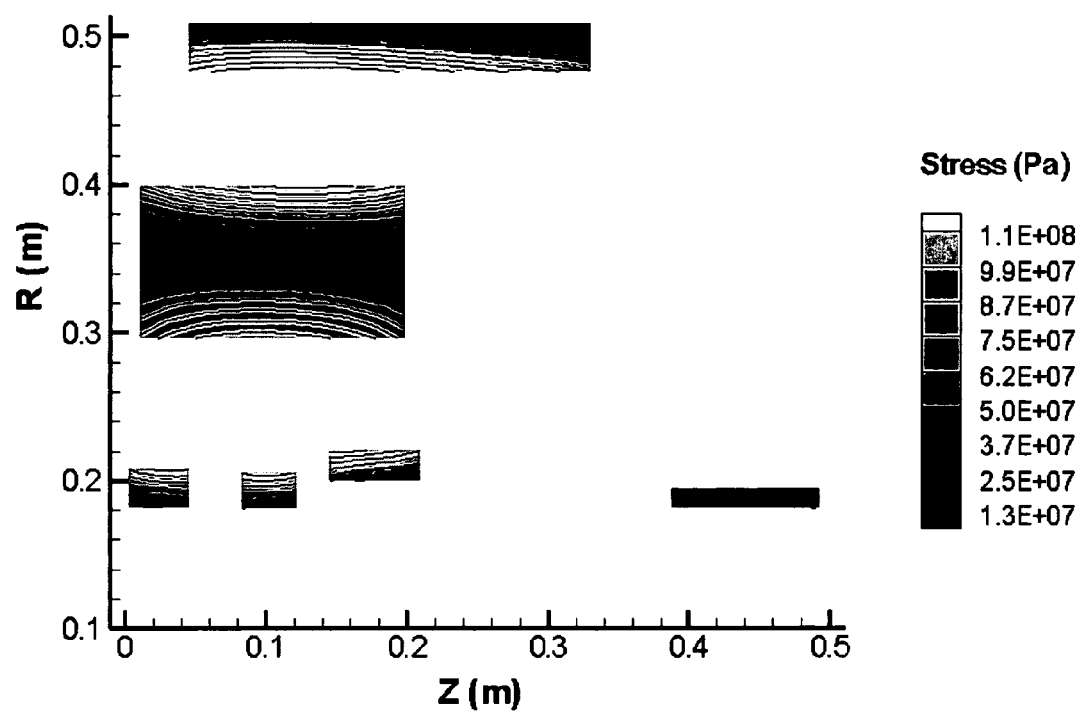
Figure 1E:
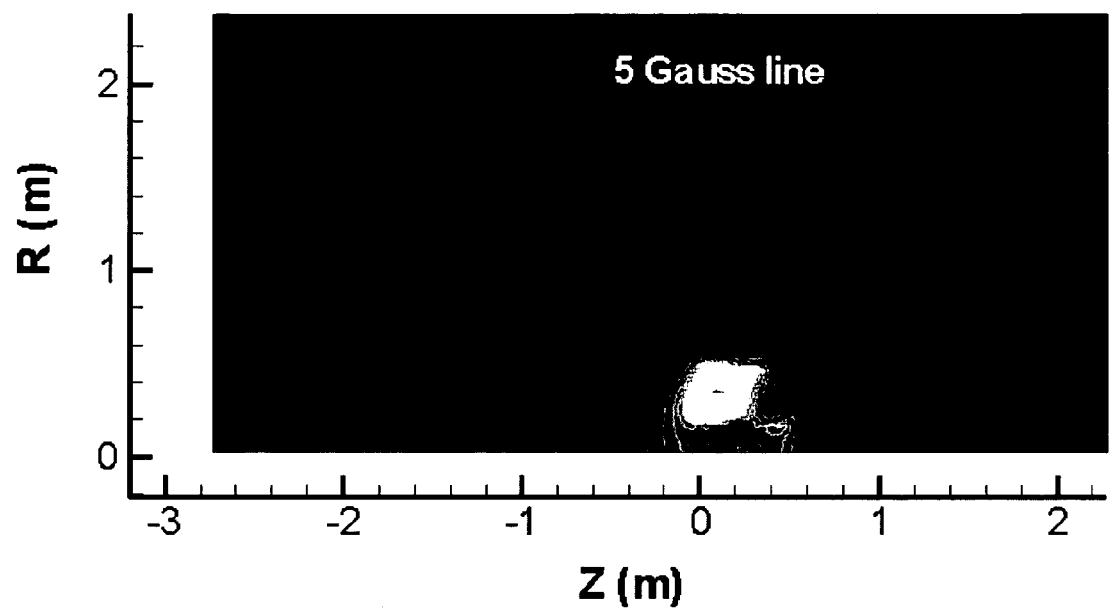
Figure 1F:
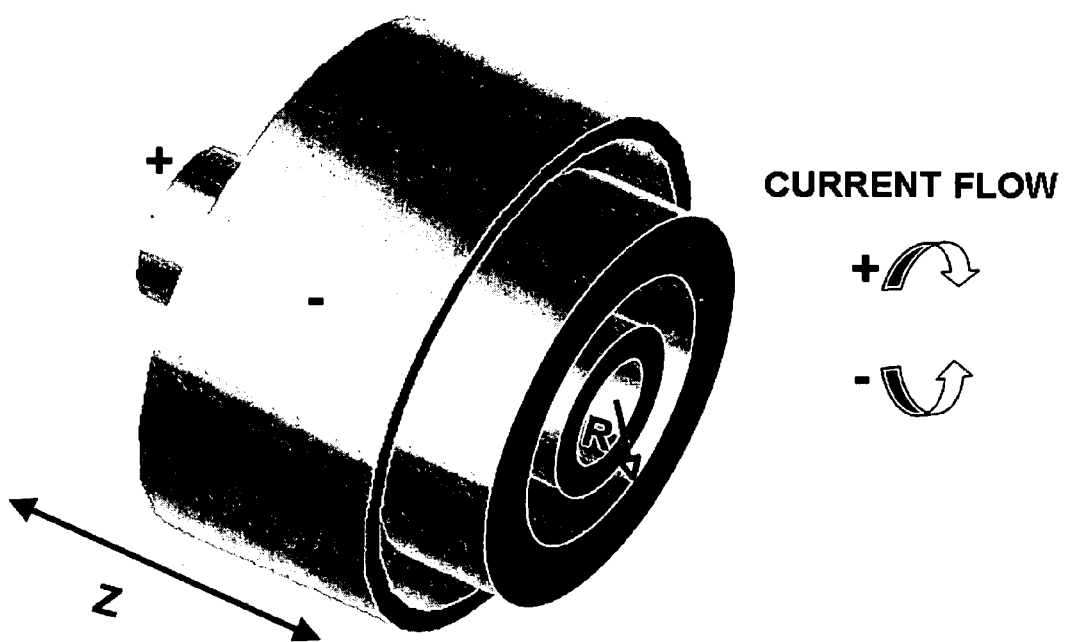
Figure 1G:
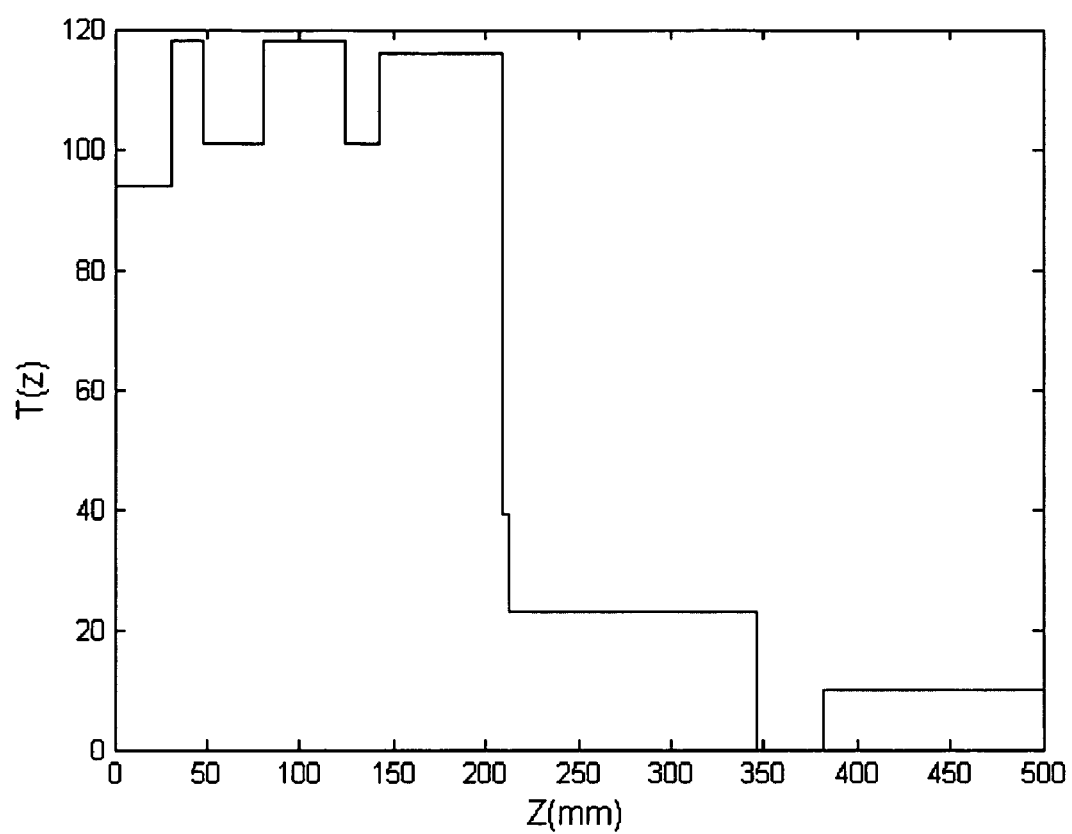

FIG. 1A shows the six coils used in the magnet, FIG. 1B shows the calculated axial magnetic field generated by the magnet, including the magnet's dsv, FIG. 1C shows the calculated magnitudes of the total magnetic field generated by the magnet within the magnet's various coils, FIG. 1D shows the calculated hoop stresses in the coils, FIG. 1E shows the calculated stray external fields, and FIG. 1G is a perspective view of the coils of the magnet.

As shown in FIG. 1B, the magnet has a dsv which is approximately spherical with a diameter of approximately 17 centimeters. The edge of the dsv is just 5 centimeters from the proximal end of the magnet. The magnet also has a 5 Gauss line which is within about 2 meters of the center of the dsv (see FIG. 1E).

As shown in FIG. 1C, the peak calculated magnetic field is less than 4.8 Tesla which is a sufficiently low peak field to allow the magnet to be constructed using relatively inexpensive superconducting wire. As shown in FIG. 1D, the maximum calculated hoop stress is 120 MPa, which is well within present day manufacturing capabilities.

As shown in FIG. 1G, the magnet has a turn distribution function which is asymmetric with respect to distance along the longitudinal axis, i.e., the magnet has more than 50% of its turns located closer to the magnet's proximal end than to its distal end. The magnets of Examples 2, 3, and 4 also have such asymmetric turn distribution functions.

Table 1 shows the coil geometry and the magnitudes of the current densities in each coil for a constant transport current of 180 amperes. As shown in this table, the current density for the $C_1$ and $C_4$ coils is 80 amps/mm$^2$, while that for the remaining coils is 120 amps/mm$^2$. The lower current densities for the $C_1$ and $C_4$ coils result in lower calculated hoop stresses compared with those produced when all coils have the same current density.

The magnet of this example is particularly well-suited for use in orthopedic imaging of such joints as the knee, ankle, wrist, and elbow.

Example 2

This example illustrates a superconducting magnet in which the current density is increased compared to Example 1. Specifically, in Example 1, the current density was 80 amps/mm$^2$ in some coils, while in this example, the current density is 120 amps/mm$^2$ in all coils.

Figure 2A:
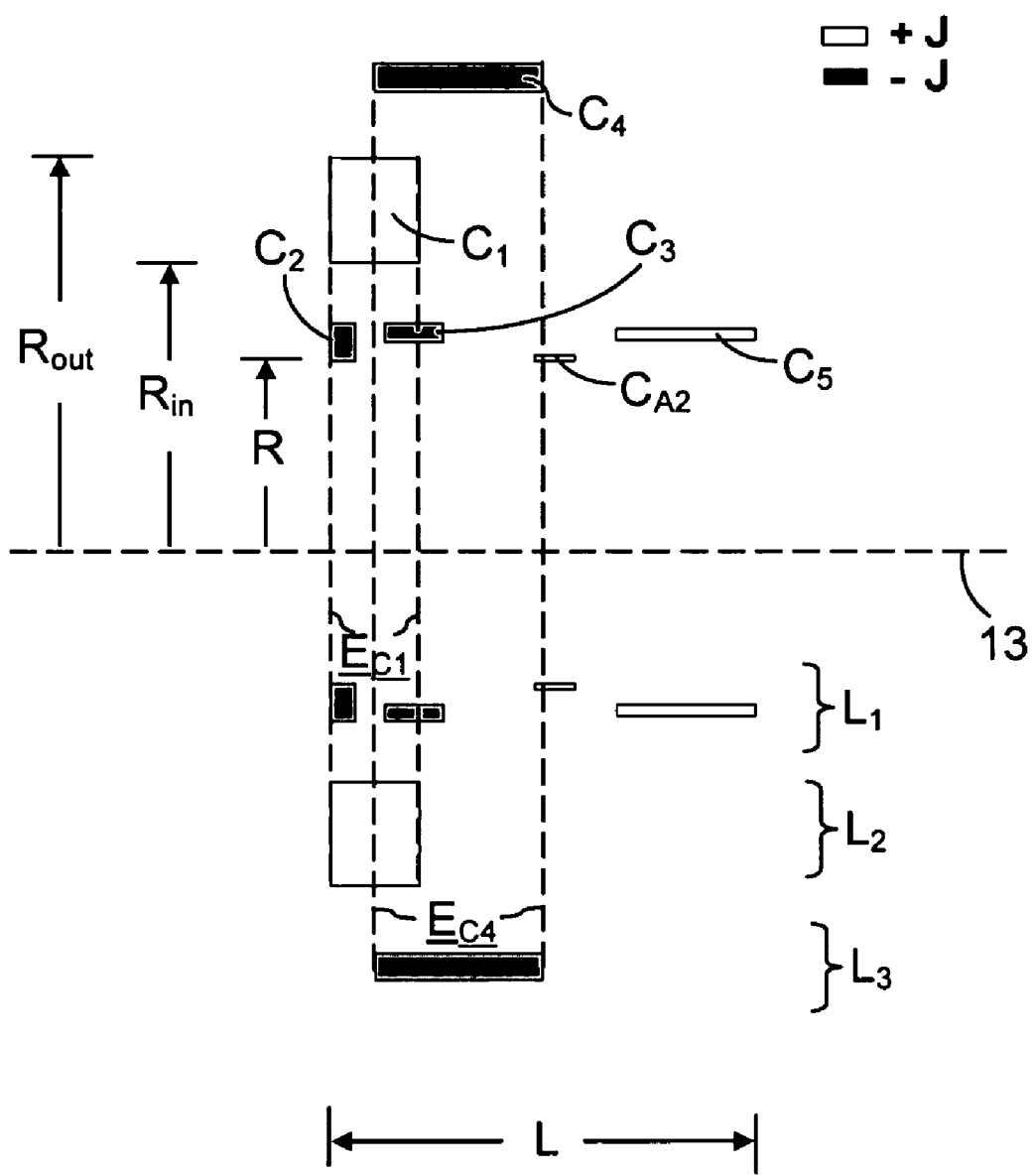
Figure 2B:
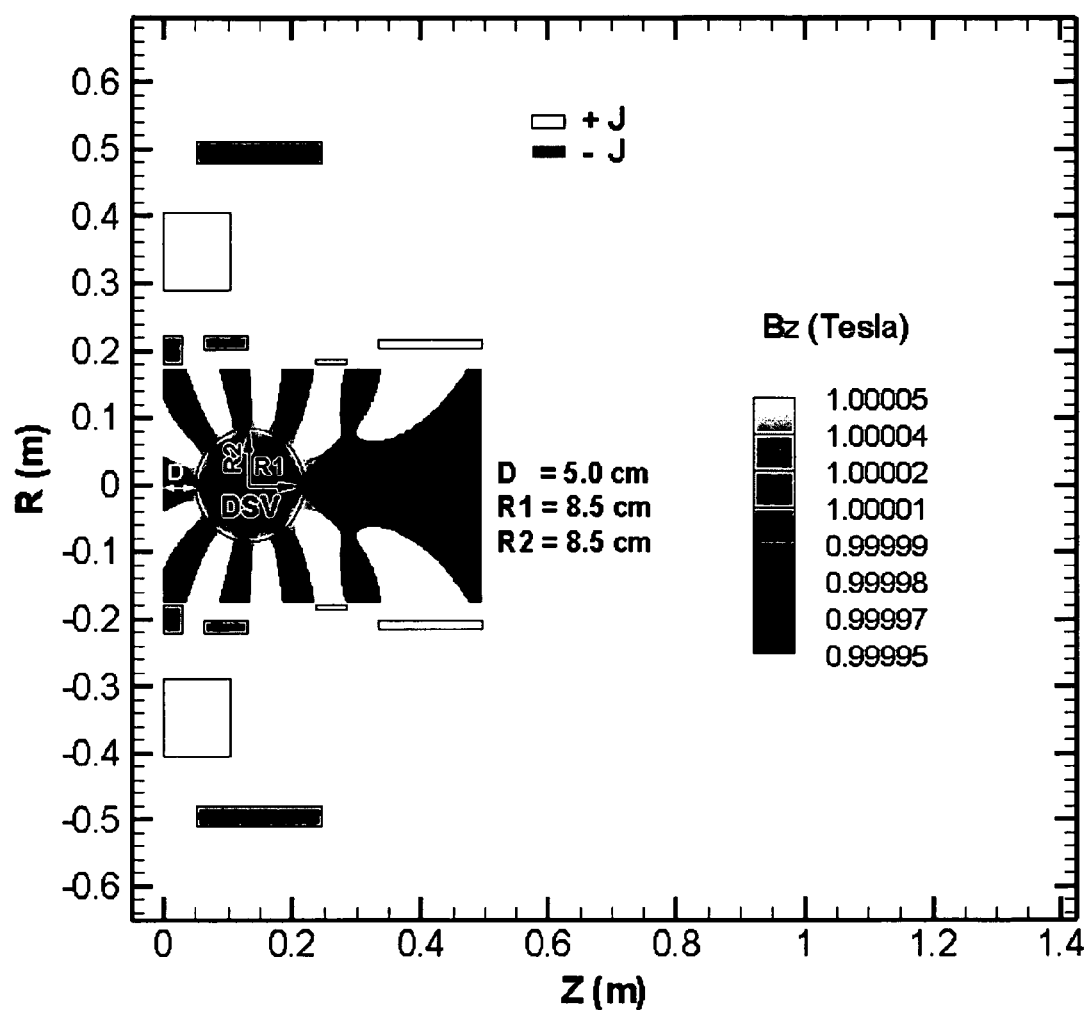
Figure 2C:
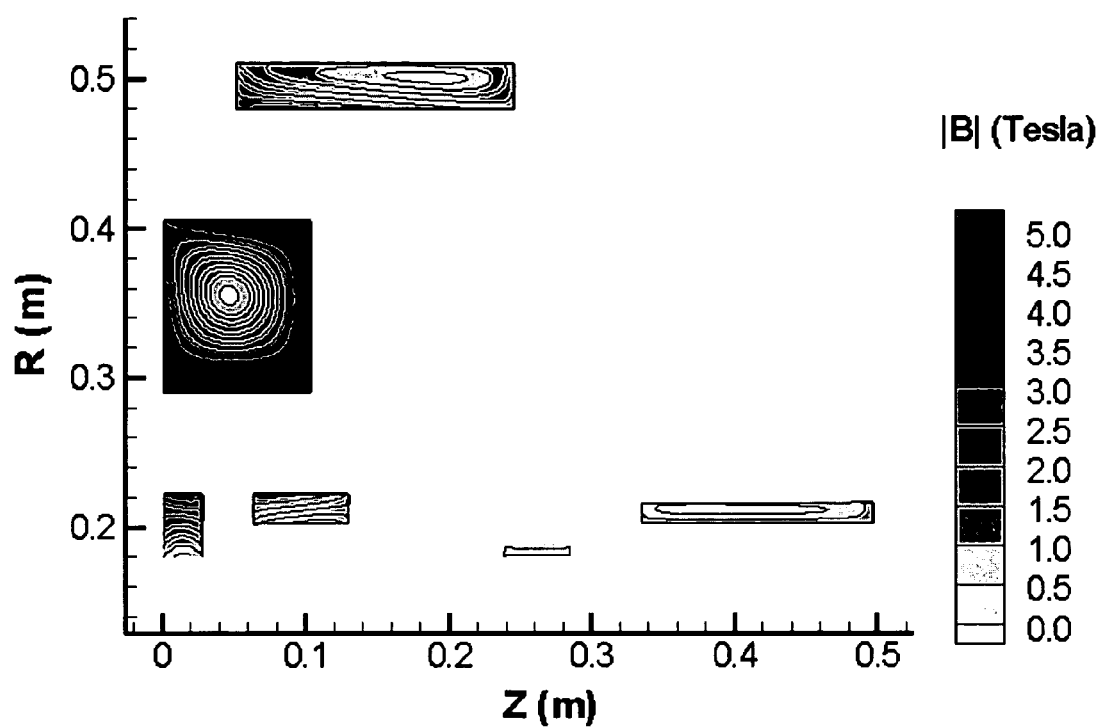
Figure 2D:
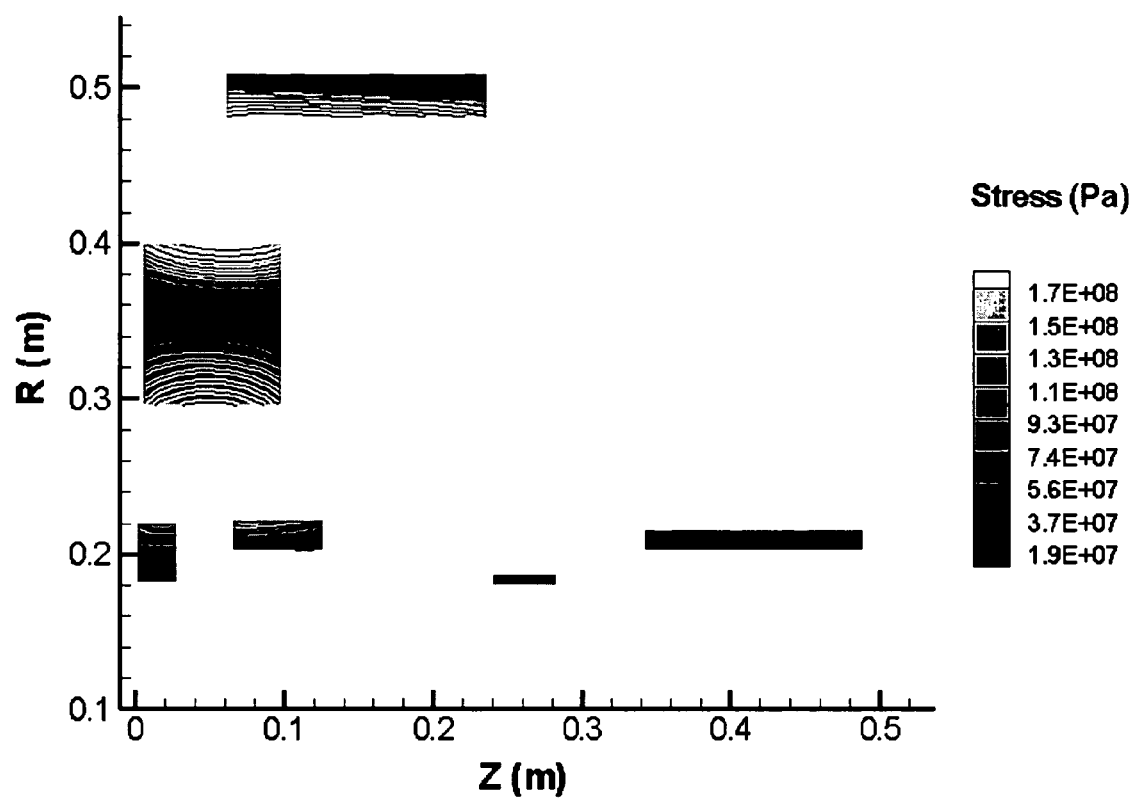
Figure 2E:
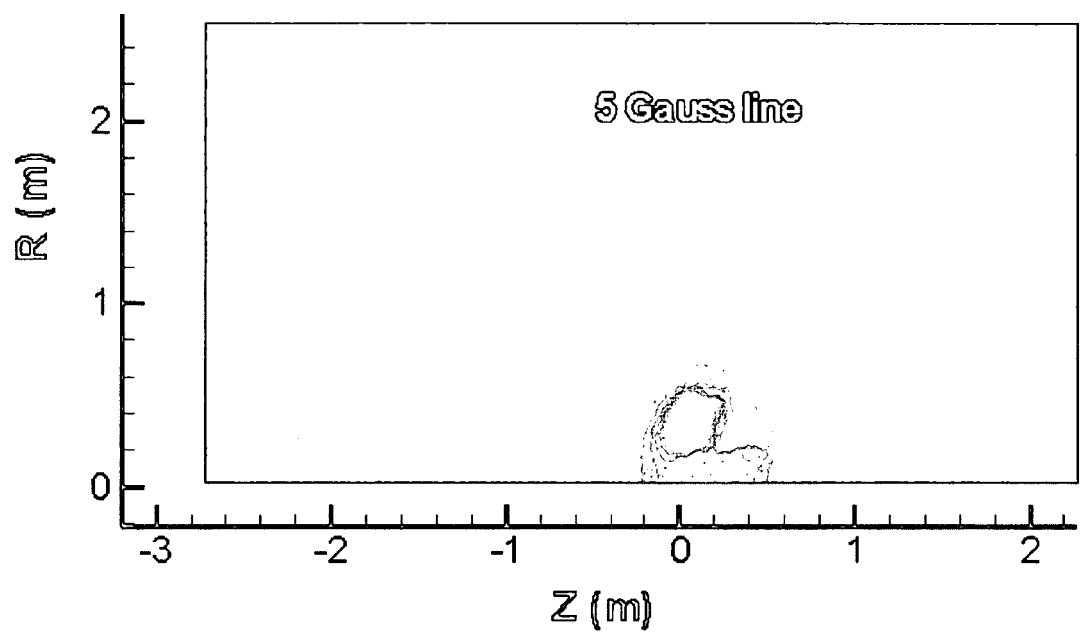

As shown in FIG. 2A, the strongest coil is now smaller than in Example 1, and instead of three negative coils located near the proximal end of the magnet, the magnet of this example only uses two such coils. However, the magnet now includes an additional positive coil ($C_{A2}$) so that the total number of coils is again six.

As in Example 1, the magnet of this example has a cold bore length (L) and a cold bore inner radius (R) of approximately 0.5 and 0.18 meters, respectively. Again like Example 1, the magnet employs active shielding provided by coil $C_4$.

As shown in FIGS. 2B-2E, the performance of the magnet is substantially the same as that of Example 1, except that the calculated hoop stresses are somewhat higher, but still well within manufacturing limits. As with the magnet of Example 1, the magnet of this example is well-suited for orthopedic and similar applications.

Example 3

This example illustrates a magnet in which a combination of active and passive shielding is used. Specifically, this example uses an active shielding coil $C_4$ in combination with a ferromagnetic structure FS to produce a low level of stray fields (see FIG. 3E).

Figure 3A:
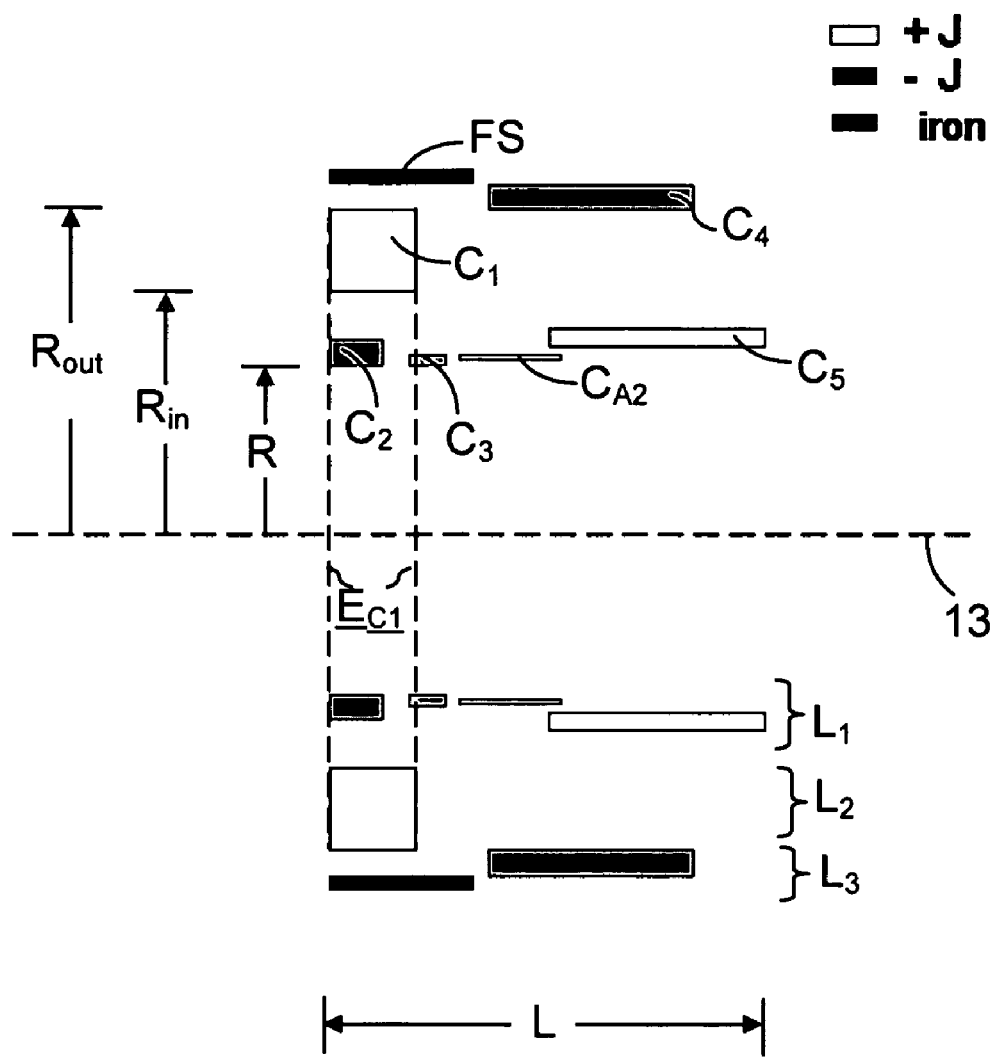
Figure 3B:
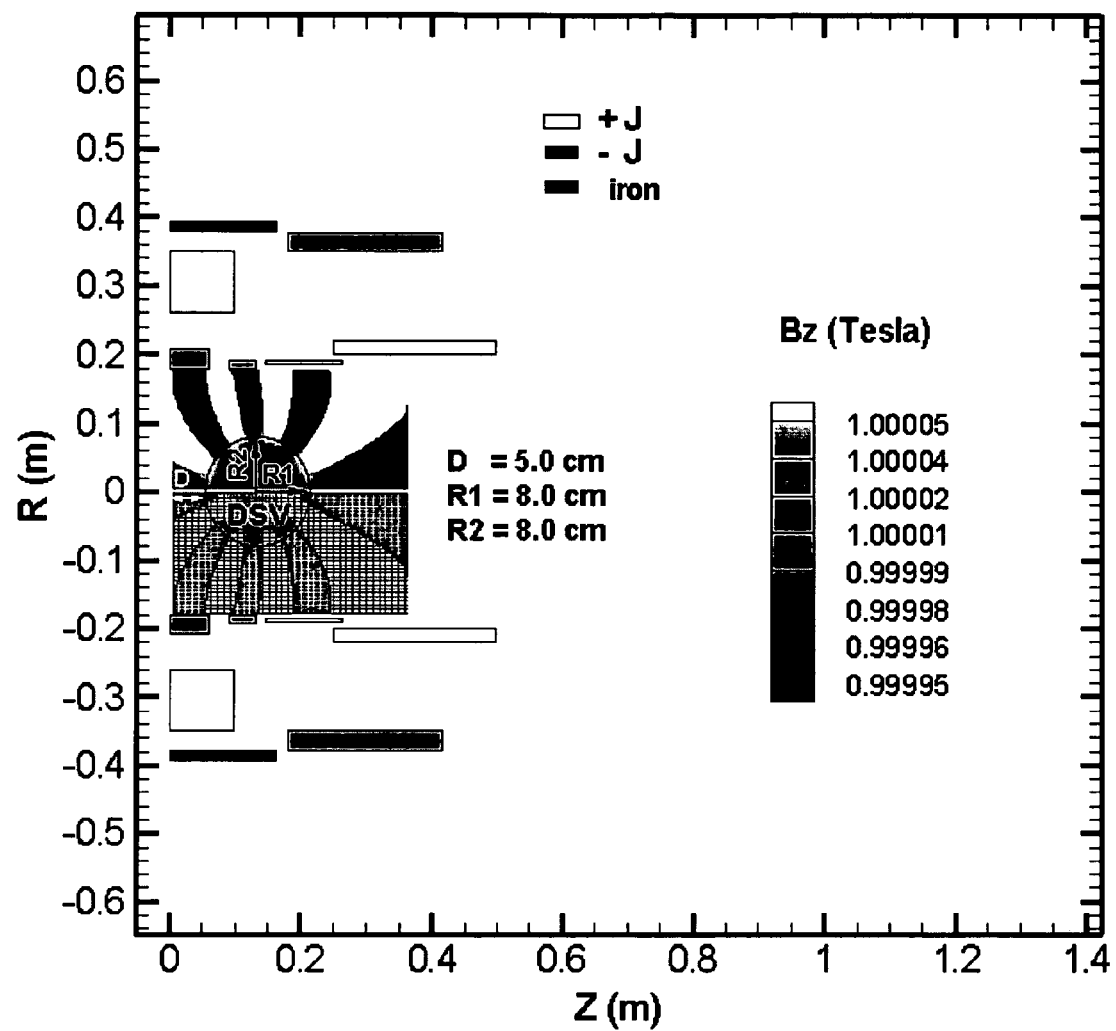
Figure 3C:
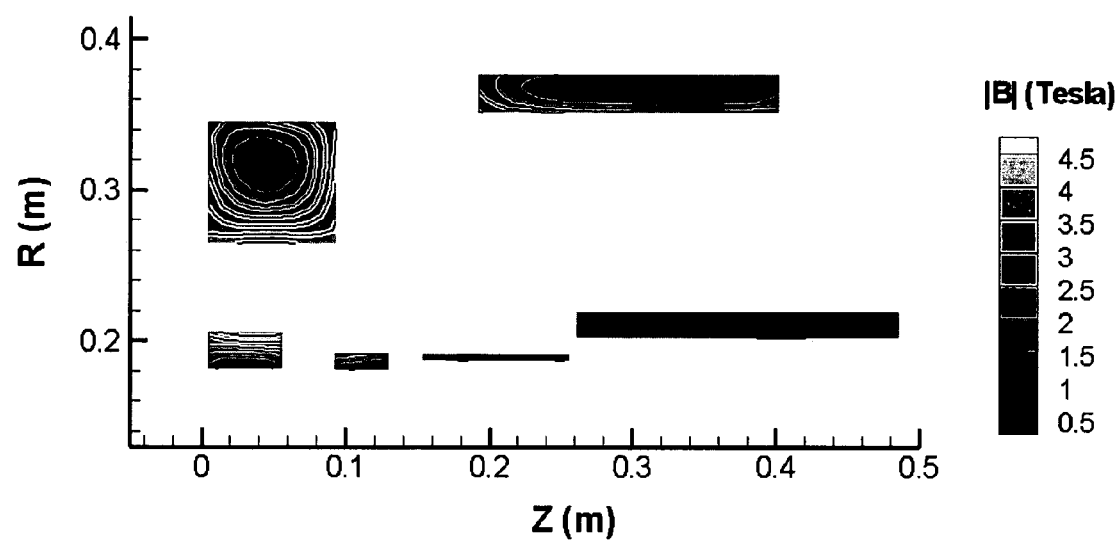
Figure 3D:
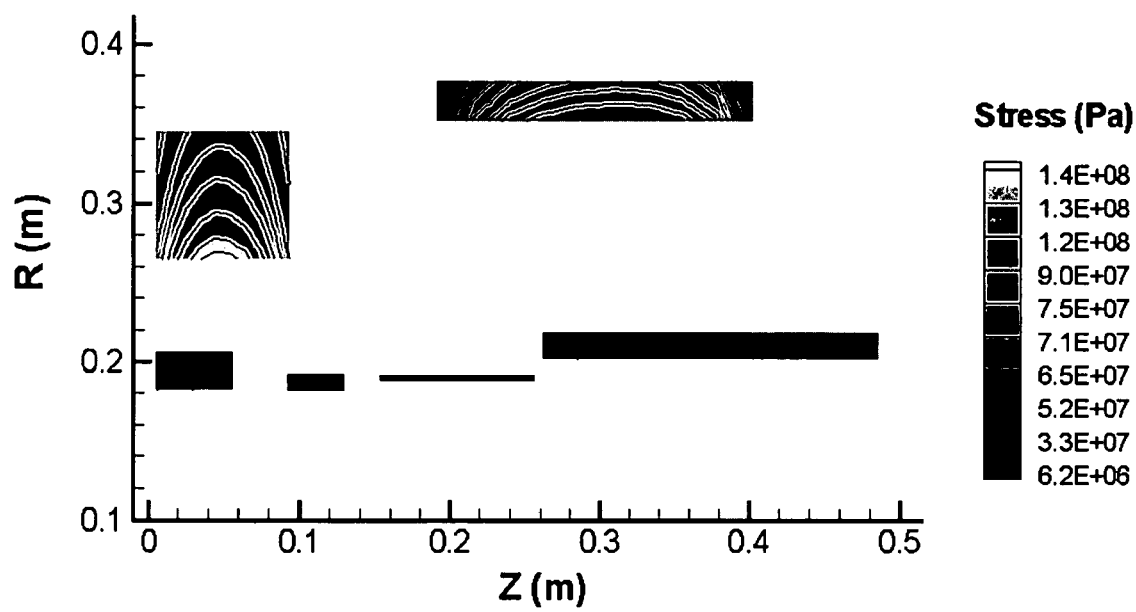
Figure 3E:
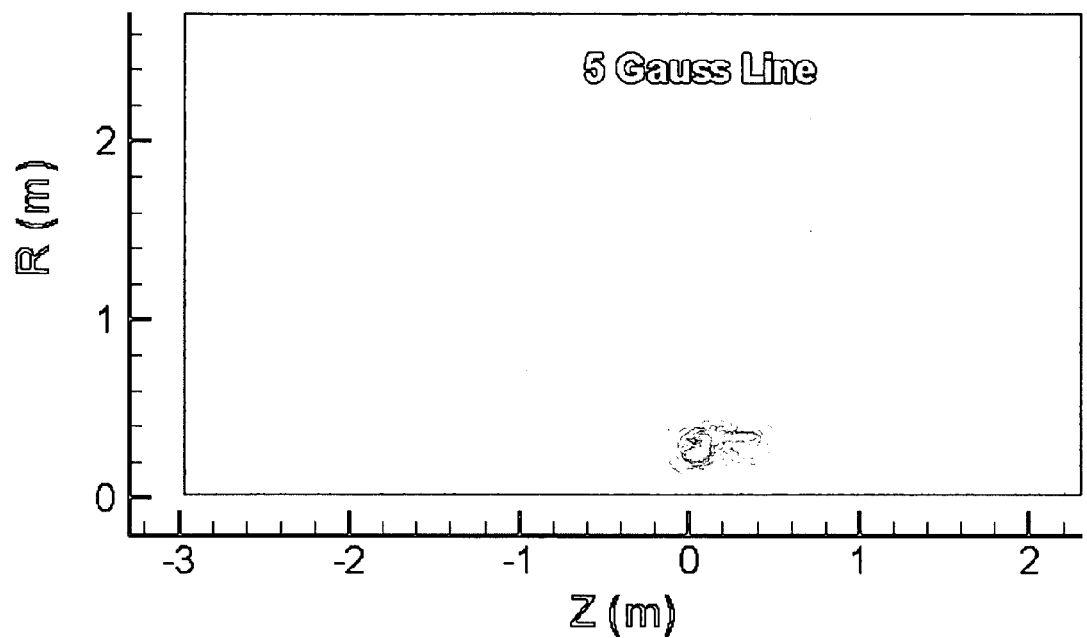
Figure 4A:
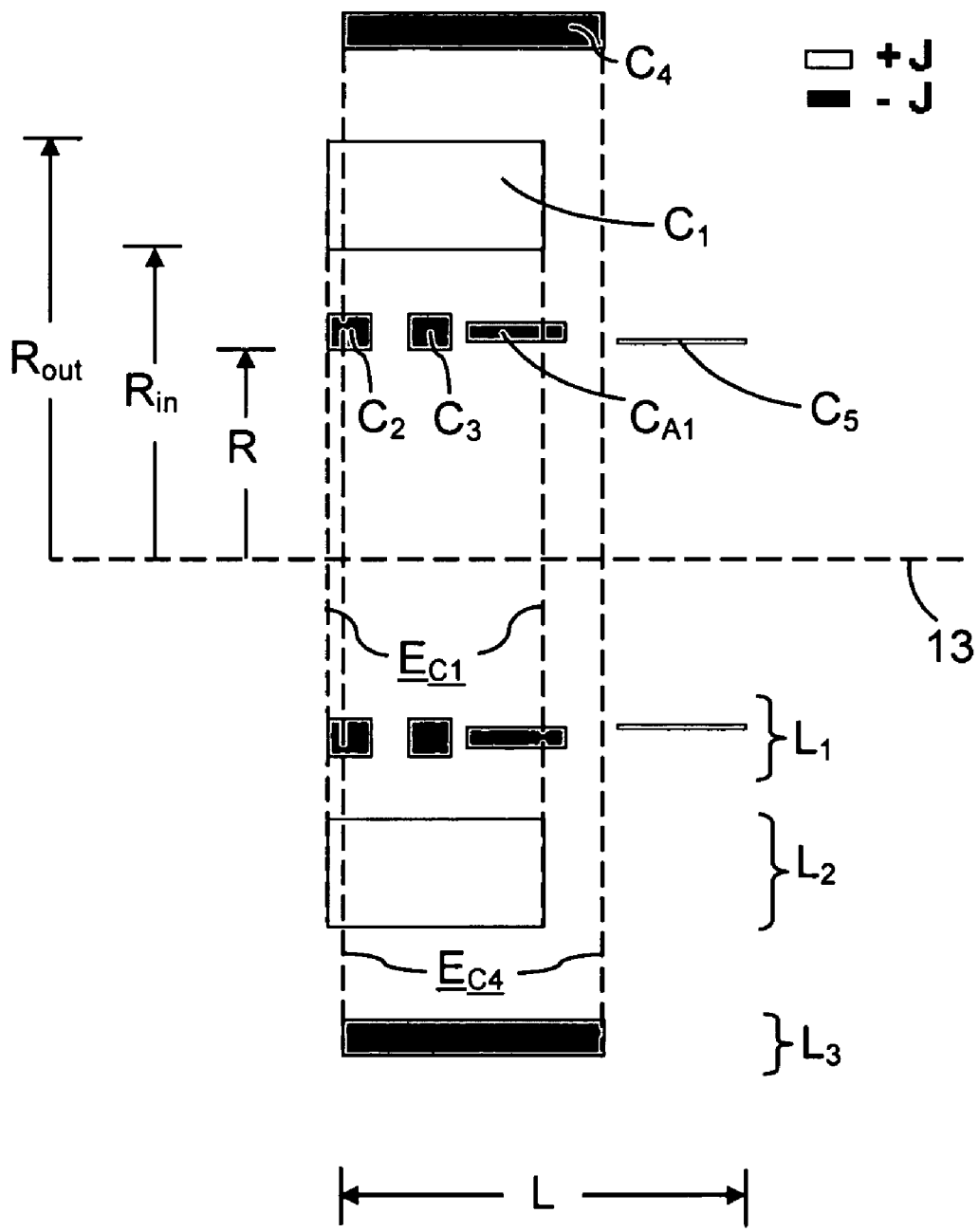
Figure 4B:
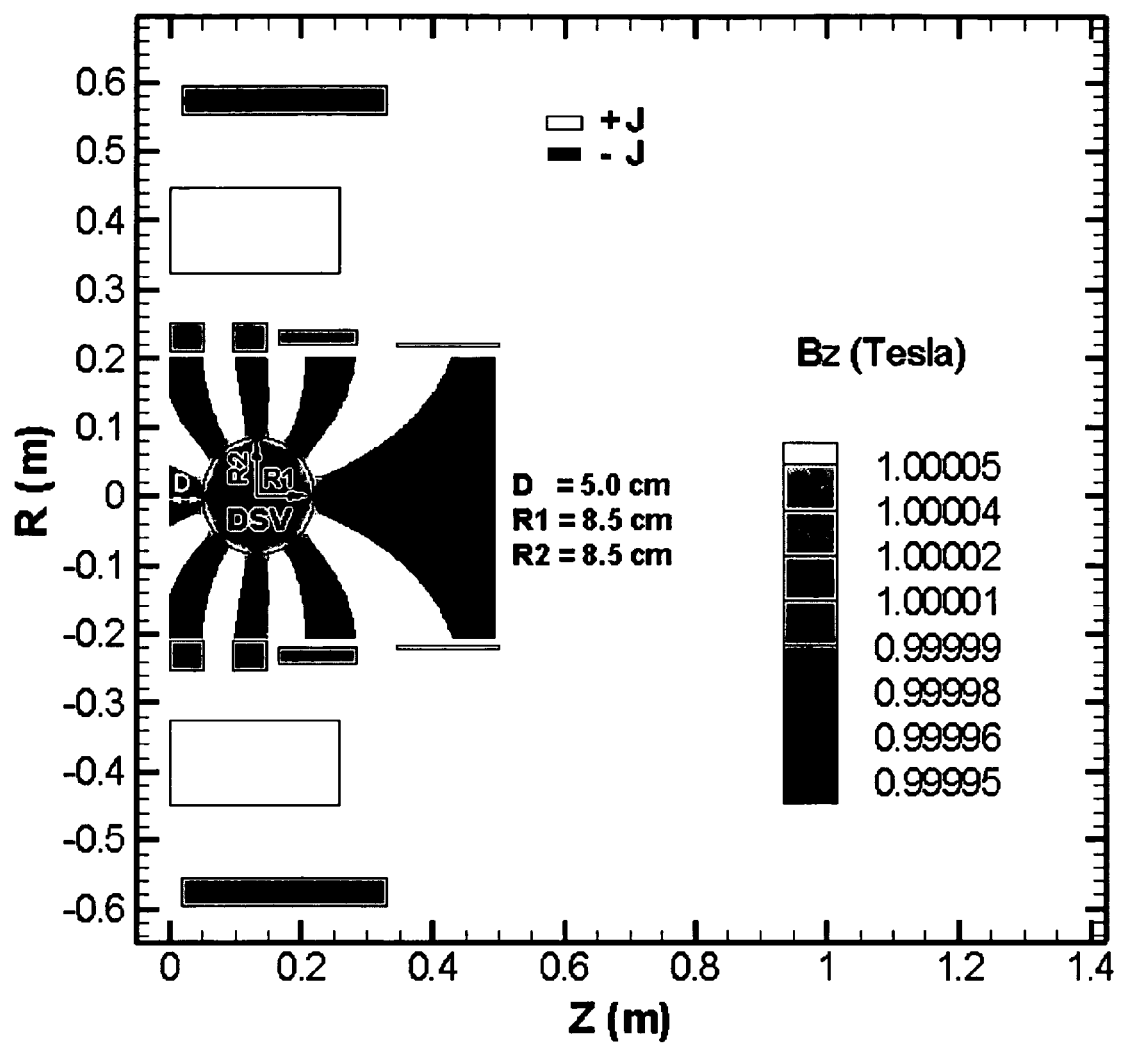
Figure 4C:
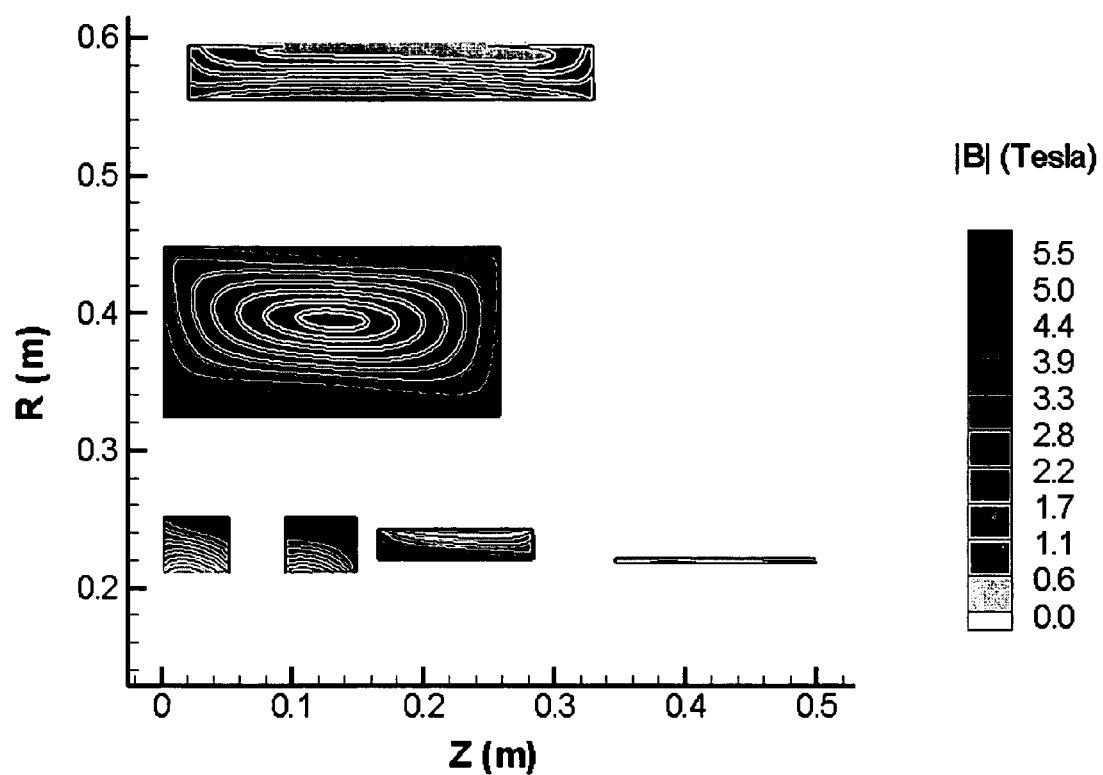
Figure 4D:
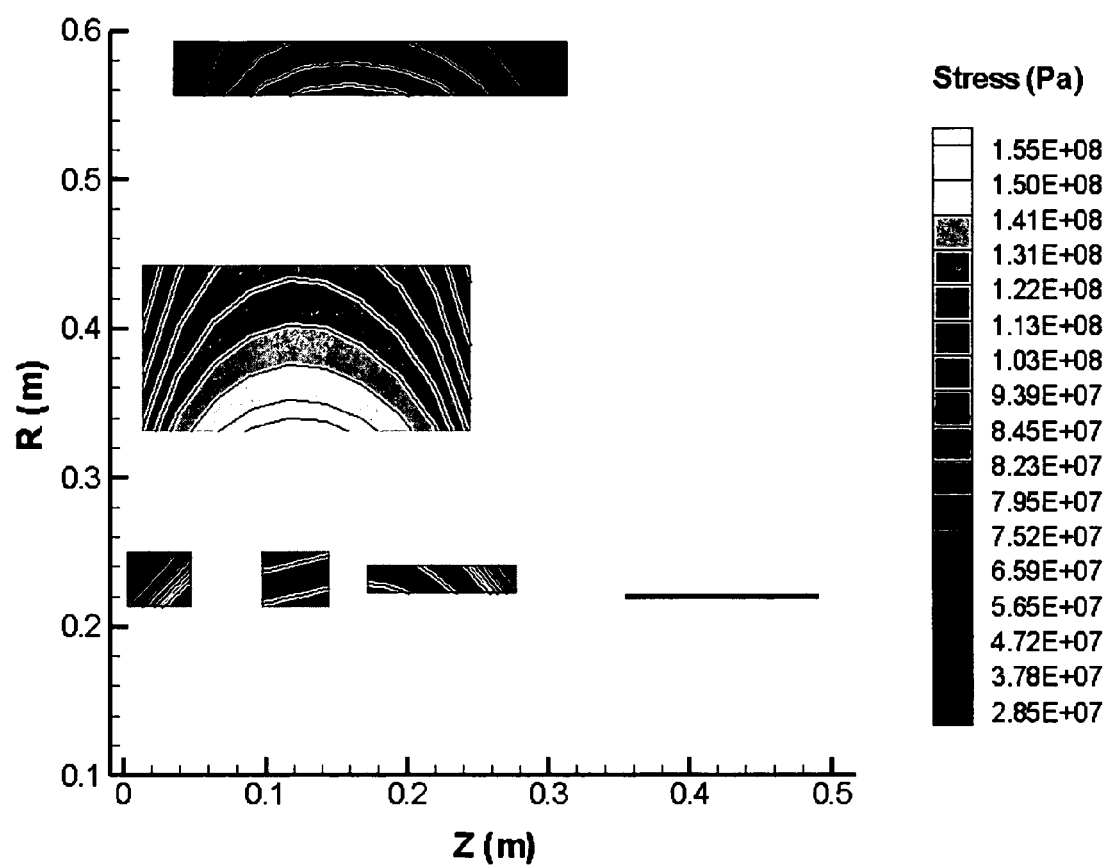
Figure 4E:
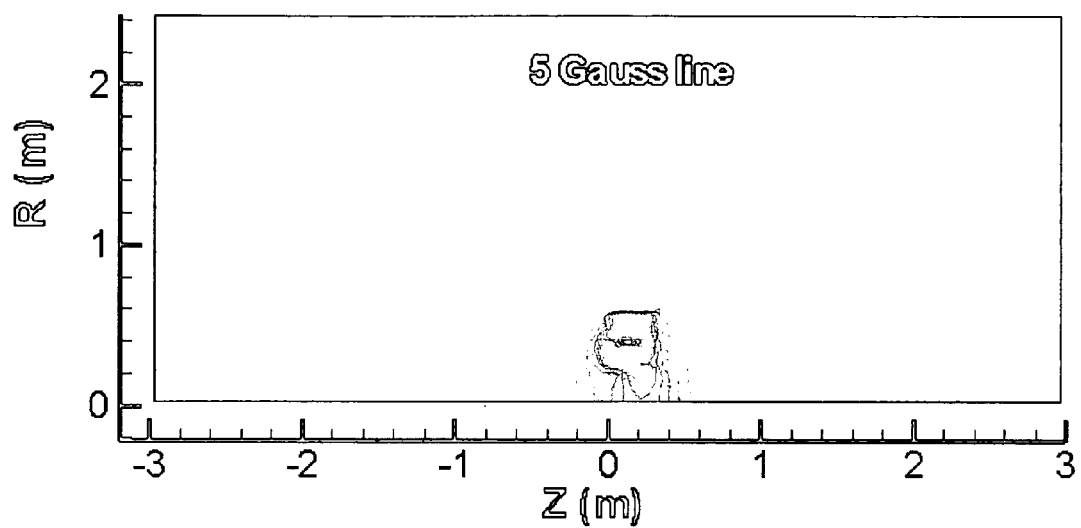

As shown in FIG. 3A, the strongest coil ($C_1$) is again smaller than that used in Example 1. As in Example 2, the magnet has two negative coils ($C_2$ and $C_3$) located near the proximal end of the magnet and an additional positive coil ($C_{A2}$) which brings the total number of coils used in the magnet to six.

Table 2 shows the coil geometry and the magnitudes of the current densities in each coil for a constant transport current of 180 amperes. As shown in this table, the current density for each of the coils is 120 amps/mm$^2$. Compared to Example 2, which also used a current density of 120 amps/mm$^2$ for each of its coils, this example exhibits lower calculated hoop stresses because of the use of the ferromagnetic structure.

The magnet of this example has essentially the same cold bore length and cold bore inner radius as Example 1, i.e., a cold bore length (L) of approximately 0.5 meters and a cold bore inner radius (R) of approximately 0.18 meters. As shown in FIGS. 3B-3E, the performance of the magnet is substantially the same as that of Example 1. In particular, this example achieves calculated hoop stresses which are substantially equal to those of Example 1. As with the magnets of Examples 1 and 2, the magnet of this example is well-suited for orthopedic and similar applications.

Example 4

This example illustrates a variation of the magnet of Example 1 in which the cold bore radius (R) has been increased from 18 centimeters to 21 centimeters. As in Example 1, a current density of 80 amps/mm$^2$ is used for coils $C_1$ and $C_4$, and a current density of 120 amps/mm$^2$ for the remaining coils.

This magnet allows for imaging of somewhat larger anatomical structures (e.g., larger legs) while achieving the same level of performance as Example 1 (see FIGS. 4B-4E).

Although specific embodiments of the invention have been described and illustrated, it will be understood by those skilled in the art that various changes to the details presented here may be made, without departing from the spirit and scope of this invention. For example, although the magnets of invention have been illustrated in connection with partial body imaging, the invention can also be used for whole body imaging.

A variety of other modifications will be evident to persons of ordinary skill in the art from the disclosure herein. The following claims are intended to cover the specific embodiments set forth herein as well as such modifications, variations, and equivalents.

TABLE 1

| Coil | R1(meters) | R2(meters) |
|---|---|---|
| $C_1$ | 0.290000000000000000 | 0.404999999930262700 |
| $C_2$ | 0.180000000000000000 | 0.209827311172828270 |
| $C_3$ | 0.180000001273164870 | 0.206570354798586680 |
| $C_{A1}$ | 0.198717490489274310 | 0.221999999975599580 |
| $C_4$ | 0.474000006916308280 | 0.510000000000000000 |
| $C_5$ | 0.180133485591198070 | 0.195027084982257630 |

| Coil | Z1(meters) | Z2(meters) |
|---|---|---|
| $C_1$ | 0.000000000000000000 | 0.209558656371392840 |
| $C_2$ | 0.000000000000000000 | 0.047886228086666024 |
| $C_3$ | 0.080969858927526978 | 0.124345806485301360 |
| $C_{A1}$ | 0.142116645336002550 | 0.212687732580072670 |
| $C_4$ | 0.029949696341661346 | 0.346155869982414880 |
| $C_5$ | 0.382207152021705130 | 0.499538005749258610 |

| Coil | \|J\| (A/meters$^2$) |
|---|---|
| $C_1$ | 0.8 × 10$^8$ |
| $C_2$ | 1.2 × 10$^8$ |
| $C_3$ | 1.2 × 10$^8$ |
| $C_{A1}$ | 1.2 × 10$^8$ |
| $C_4$ | 0.8 × 10$^8$ |
| $C_5$ | 1.2 × 10$^8$ |

TABLE 2

| Coil | R1(meters) | R2(meters) |
|---|---|---|
| $C_1$ | 0.260000000001521900 | 0.349616693336864020 |
| $C_2$ | 0.180000000011987900 | 0.206907876493375750 |
| $C_3$ | 0.180002331535285300 | 0.192182576700692660 |
| $C_{A2}$ | 0.186658451978235130 | 0.191147120623393840 |
| $C_4$ | 0.350000000000000000 | 0.377994659411485470 |
| $C_5$ | 0.200654458955775990 | 0.219704801767727860 |
| FS | 0.379516472730328740 | 0.394295598847026750 |

| Coil | Z1(meters) | Z2(meters) |
|---|---|---|
| $C_1$ | 0.000000000000000000 | 0.098347294272720140 |
| $C_2$ | 0.001461766783591458 | 0.059701534438463599 |
| $C_3$ | 0.090055202677123483 | 0.132264577966073910 |
| $C_{A2}$ | 0.147771210123563010 | 0.262483637352821820 |
| $C_4$ | 0.180000262569938900 | 0.414157594425332230 |
| $C_5$ | 0.249212147033105740 | 0.498465948896390340 |
| FS | 0.001735964919432593 | 0.161863415255095290 |

| Coil | \|J\| (A/meters$^2$) |
|---|---|
| $C_1$ | 1.2 × 10$^8$ |
| $C_2$ | 1.2 × 10$^8$ |

TABLE 2-continued

| $C_3$ | 1.2 × 10$^8$ |
|---|---|
| $C_{A2}$ | 1.2 × 10$^8$ |
| $C_4$ | 1.2 × 10$^8$ |
| $C_5$ | 1.2 × 10$^8$ |

What is claimed is:

1. A magnetic resonance system for producing MR images comprising a magnet which has a longitudinal axis and produces a longitudinal magnetic field over a predetermined region (the "dsv"), said magnet comprising a plurality of current-carrying coils which surround the axis, are distributed along the axis, and define a turn distribution function T(z) for the magnet which varies with distance z along the axis and is equal to the sum of the number of turns in all coils at longitudinal position z, wherein:
   (A) the longitudinal extent of the plurality of coils defines first and second ends for the magnet;
   (B) the dsv defines a midpoint M which is closer to the first end than to the second end;
   (C) the turn distribution function T(z) is asymmetric with respect to distance z along the longitudinal axis, with more than 50 percent of the turns being located closer to the first end than to the second end;
   (D) the plurality of current-carrying coils comprises:
      (i). a first coil which has an inner radius $R_{in}$, an outer radius $R_{out}$, and which:
         (a) provides a contribution to the magnetic field at the center of the dsv that is larger in magnitude than the magnitude of the contribution of any other of the plurality of current-carrying coils,
         (b) is located closer to the first end than to the second end, and
         (c) defines an internal envelope; and
      (ii) second and third coils each of which:
         (a) has an outer radius which is less than $R_{in}$;
         (b) lies at least in part within the internal envelope of the first coil; and
         (c) carries current in a direction opposite to the direction of current in the first coil; and
   (E) to reduce stray magnetic fields external to the magnet:
      (i) the plurality of coils comprises a fourth coil which:
         (a) has an inner radius which is greater than $R_{in}$; and
         (b) carries current in a direction opposite to the direction of current in the first coil; or
      (ii) the magnet comprises a ferromagnetic structure which is rotationally-symmetric about the longitudinal axis and whose minimum inner radius is greater than $R_{in}$; or
      (iii) the magnet comprises a ferromagnetic structure which is rotationally-symmetric about the longitudinal axis and whose minimum inner radius is greater than $R_{in}$ and the plurality of coils comprises a fourth coil which:
         (a) has an inner radius which is greater than $R_{in}$; and
         (b) carries current in a direction opposite to the direction of current in the first coil.

2. The magnetic resonance system of claim 1 wherein the fourth coil has an inner radius which is greater than or equal to $R_{out}$.

3. The magnetic resonance system of claim 1 wherein the fourth coil defines an internal envelope and at least a portion of the first coil lies within said internal envelope.

4. The magnetic resonance system of claim 1 wherein the minimum inner radius of the ferromagnetic structure is greater than or equal to $R_{out}$.

5. The magnetic resonance system of claim 1 wherein all coils which lie either entirely or partially within the internal envelope of the first coil carry current in a direction opposite to the direction of current in the first coil.

6. The magnetic resonance system of claim 1 wherein the plurality of coils comprises a fifth coil which:
   (a) has an outer radius which is less than $R_{in}$;
   (b) lies outside of the internal envelope of the first coil; and
   (c) carries current in the same direction as the current in the first coil.

7. The magnetic resonance system of claim 6 wherein the fifth coil defines the second end of the magnet.

8. The magnetic resonance system of claim 1 wherein the plurality of coils comprises:
   (i) a coil which:
      (a) has an outer radius which is less than $R_{in}$;
      (b) lies at least in part within the internal envelope of the first coil; and
      (c) carries current in a direction opposite to the direction of current in the first coil; and/or
   (ii) a coil which:
      (a) has an outer radius which is less than or equal to $R_{in}$;
      (b) lies outside of the internal envelope of the first coil; and
      (c) carries current in the same direction as the current in the first coil.

9. The magnetic resonance system of claim 1 wherein the plurality of coils consists of a total of six coils.

10. The magnetic resonance system of claim 1 wherein:
   (i) the dsv has an external surface defined by a computed variation of the longitudinal magnetic field relative to the longitudinal magnetic field at the midpoint M of 20 parts per million peak-to-peak; and
   (ii) the shortest distance D between the external surface and the first end is less than or equal to 15 centimeters.

11. The magnetic resonance system of claim 10 wherein D is less than or equal to 10 centimeters.

12. The magnetic resonance system of claim 10 wherein D is 5 centimeters.

13. The magnetic resonance system of claim 10 wherein the volume $V_{dsv}$ within said external surface satisfies the relationship:

$$V_{dsv} \geq 2{,}000 \text{cm}^3.$$

14. The magnetic resonance system of claim 13 wherein at least one of the second and third coils has an inner radius that is less than or equal to 25 centimeters.

15. The magnetic resonance system of claim 14 wherein the first and second ends are spaced apart by a distance L which satisfies the relationship:

$$L \leq 60 \text{ centimeters.}$$

16. The magnetic resonance system of claim 10 wherein the volume contained within said external surface is $V_{dsv}$, the magnet has a cold bore volume $V_{bore}$, and $V_{dsv}$ and $V_{bore}$ satisfy the relationship:

$$V_{dsv}/V_{bore} \geq 0.2.$$

17. The magnetic resonance system of claim 1 wherein the calculated stray magnetic field external to the magnet is less than or equal to $5 \times 10^{-4}$ Tesla at all locations greater than 2 meters from the midpoint M of the dsv.

18. The magnetic resonance system of claim 1 wherein the calculated peak magnetic field within any of the plurality of current carrying coils has a magnitude that is less than 5 times the magnitude of the calculated axial magnetic field at the midpoint M of the dsv.

19. The magnetic resonance system of claim 1 wherein the maximum calculated hoop stress within any of the plurality of current carrying coils is less than or equal to 250 MPa.

20. A method of forming a magnetic resonance image of a portion of a subject's body comprising:
   (A) providing a magnetic resonance system in accordance with claim 10;
   (B) placing the portion of the subject's body in the dsv; and
   (C) using the magnetic resonance system to form a magnetic resonance image of the portion of the subject's body.

21. The method of claim 20 wherein the portion of the subject's body is the subject's arm, wrist, elbow, leg, ankle, or knee.

* * * * *